United States Patent
Kitada

(10) Patent No.: US 9,544,229 B2
(45) Date of Patent: Jan. 10, 2017

(54) PACKET PROCESSING APPARATUS AND PACKET PROCESSING METHOD

(71) Applicant: FUJITSU LIMITED, Kawasaki-shi, Kanagawa (JP)

(72) Inventor: Atsushi Kitada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 58 days.

(21) Appl. No.: 14/661,354

(22) Filed: Mar. 18, 2015

(65) Prior Publication Data
US 2015/0279437 A1 Oct. 1, 2015

(30) Foreign Application Priority Data

Mar. 26, 2014 (JP) .................. 2014-063992

(51) Int. Cl.
*G06F 12/00* (2006.01)
*H04L 12/747* (2013.01)
*G11C 8/12* (2006.01)

(52) U.S. Cl.
CPC ............... *H04L 45/742* (2013.01); *G11C 8/12* (2013.01)

(58) Field of Classification Search
CPC ................................. H04L 45/742; G11C 8/12
USPC ................................. 711/105, 106
See application file for complete search history.

(56) References Cited

U.S. PATENT DOCUMENTS

| | | | |
|---|---|---|---|
| 8,619,558 B1 * | 12/2013 | Lok | H04L 49/901 370/229 |
| 2009/0172318 A1 | 7/2009 | Sugai et al. | |
| 2010/0049935 A1 * | 2/2010 | Pichumani | G06F 17/30516 711/165 |
| 2010/0054272 A1 | 3/2010 | Iwamoto et al. | |
| 2011/0082910 A1 * | 4/2011 | Breslin | H04L 12/26 709/217 |
| 2012/0236789 A1 * | 9/2012 | Dravida | H04L 47/14 370/328 |
| 2013/0014114 A1 * | 1/2013 | Nagata | G06F 9/52 718/102 |
| 2015/0146731 A1 * | 5/2015 | Szyszko | H04L 47/2441 370/392 |

FOREIGN PATENT DOCUMENTS

| | | |
|---|---|---|
| JP | 2009-157680 | 7/2009 |
| JP | 2010-088102 | 4/2010 |

* cited by examiner

*Primary Examiner* — Pierre-Michel Bataille
(74) *Attorney, Agent, or Firm* — Fujitsu Patent Center

(57) ABSTRACT

A packet processing apparatus includes a processor configured to execute a process. The process includes: determining a memory from which packets are read, out of a first memory that stores the packets and a second memory that stores the packets, in accordance with number of pointers indicative of storage locations of the packets in the first memory; and reading the packets stored at the storage locations indicated by the pointers, from the memory determined at the determining.

7 Claims, 24 Drawing Sheets

FIG.8

| FLOW | BANK NUMBER | | | | | | | |
|---|---|---|---|---|---|---|---|---|
| F0 | 0 | 1 | 2 | 3 | 4 | 5 | 6 | 7 |
| F1 | 1 | 3 | 5 | 7 | 0 | 2 | 4 | 6 |
| F2 | 2 | 5 | 0 | 3 | 6 | 1 | 4 | 7 |
| ⋮ | | | | | | | | |
| Fn | 7 | 6 | 5 | 4 | 3 | 2 | 1 | 0 |

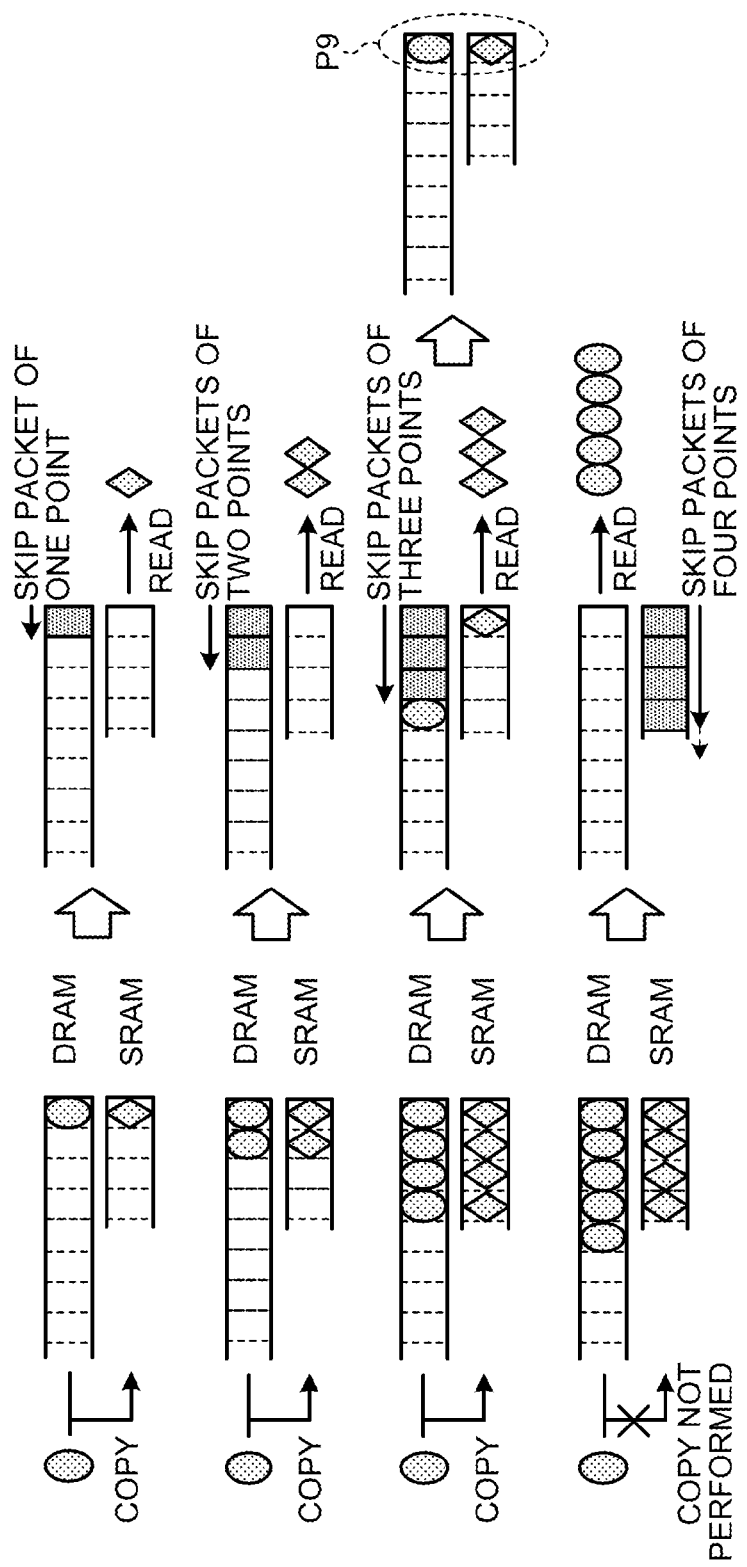

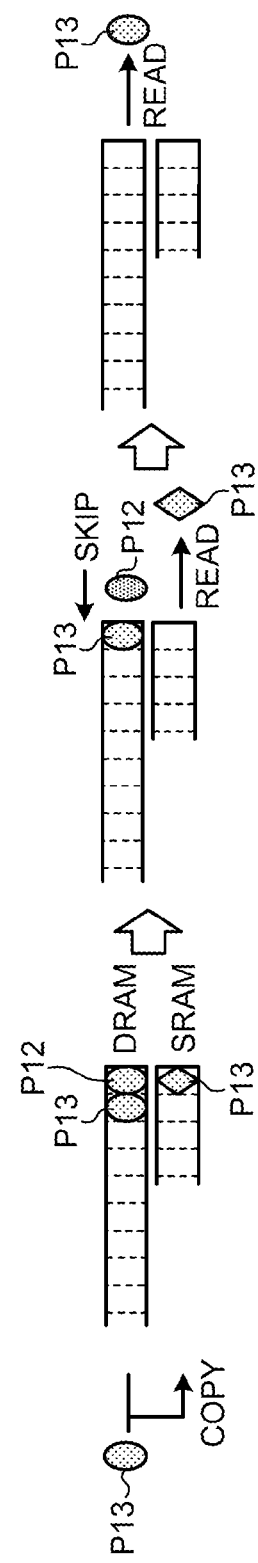

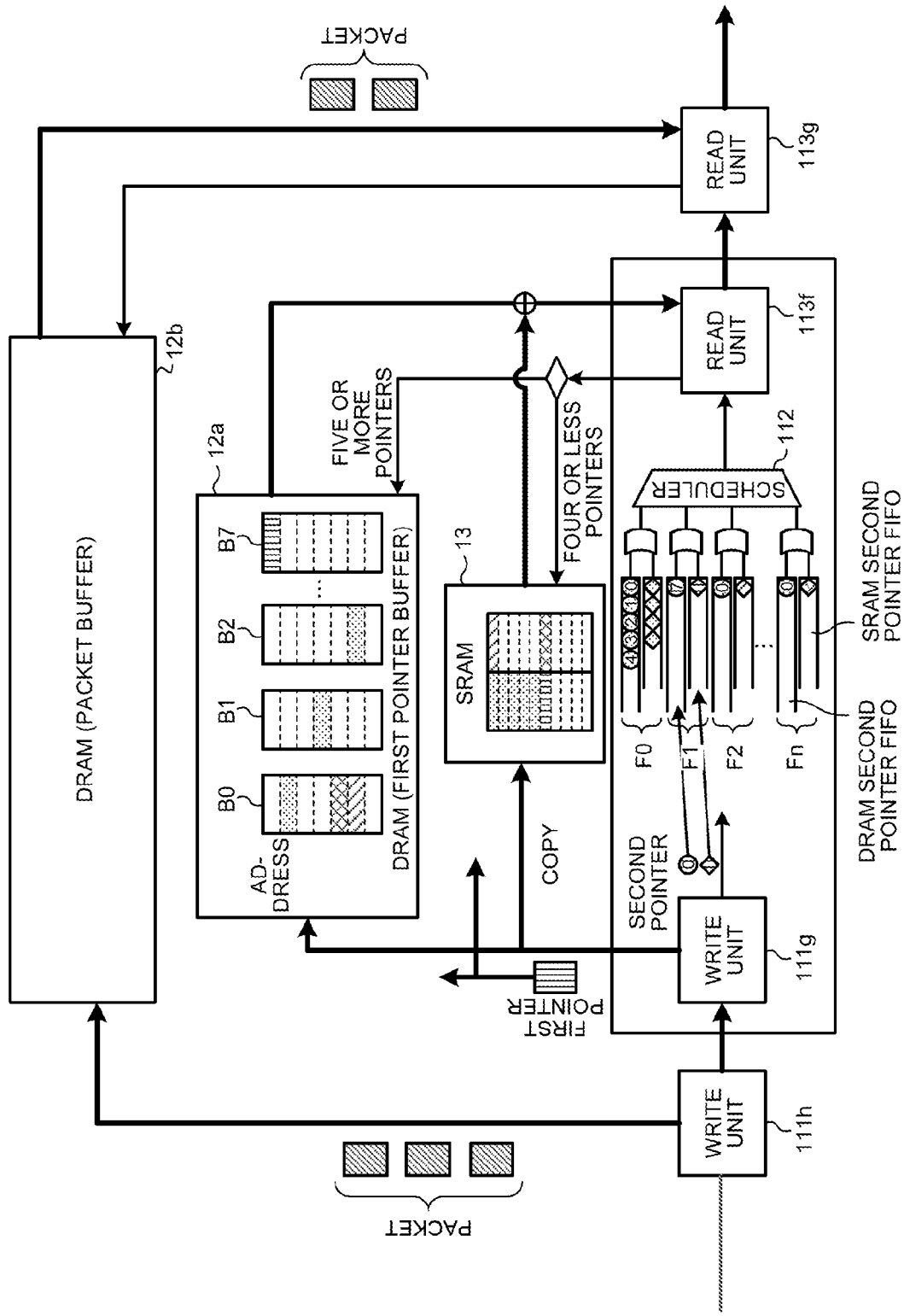

PACKET PROCESSING APPARATUS AND PACKET PROCESSING METHOD

CROSS-REFERENCE TO RELATED APPLICATION

This application is based upon and claims the benefit of priority of the prior Japanese Patent Application No. 2014-063992, filed on Mar. 26, 2014, the entire contents of which are incorporated herein by reference.

FIELD

The embodiments discussed herein are related to a packet processing apparatus and a packet processing method.

BACKGROUND

A packet processing apparatus such as switches and routers has been used. The packet processing apparatus generally includes a plurality of interface cards that input and output packets, switch cards that control packet input and output between respective interface cards, and a control card that manages an apparatus status based on control information. The interface cards receive optical signals via optical fibers from an external device. The optical signals are converted into electrical signals by an optical module and then inputted into a device having a function to perform physical/media access control (PHY/MAC) processing. This device extracts packets from the electrical signals and inputs them into a subsequent packet processing circuit. Examples of the packet processing circuit include a field programmable gate array (FPGA), an application specific integrated circuit (ASIC), and a network processing unit (NPU).

The packets that have reached an interface card on the packet receiving side are subjected to flow control by a policer, so that their input rate is limited to a specified rate or lower. The packets which passed the receiving-side interface card travel through a switch card and then reach an interface card on the packet transmitting side. The transmitting-side interface card performs copy processing, and then executes quality of service (QoS) processing. In the QoS processing, the packets are subjected to bandwidth control processing (shaping) and/or priority control processing based on contracts. In the priority control processing, voice packets are outputted in priority to Web packets, for example.

Hereinafter, the packet control in the QoS processing (hereinafter referred to as "QoS control") will be described in detail with reference to FIGS. 20 and 21. FIG. 20 is a diagram illustrating input and output orders changed by the QoS control. As illustrated in FIG. 20, the packets inputted in order of alphabets A to G are divided into flows F0 to Fn (n being natural numbers) per QoS control unit (hereinafter referred to as "flow"), and queued into the packet processing circuit. Each of the queued packets is subjected to priority control processing (such as Strict Priority (SP)) by a scheduler SC. Packets are outputted in sequence from the flow selected based on a scheduling result. In the example illustrated in FIG. 20, the priority is set in an ascending order of flow IDs. Accordingly, packets of alphabets A, C, E, and G are outputted from the flow F0 first. Next, a packet of the alphabet F is outputted from the flow F1. Next, a packet of the alphabet D is outputted from the flow F2. Then, a packet of the alphabet B is outputted from the flow Fn. In this manner, the scheduler SC changes the order of the packets from an input order (order of alphabets A to G) to an output order (order of alphabets A, C, E, G, F, D, and B), and outputs the packets in the output order.

However, packets have various packet lengths, and some packets have an information amount as large as about 10 K bytes. Accordingly, it is inefficient for the packet processing apparatus to queue the packets themselves inside the packet processing circuit. Therefore, the packet processing apparatus generally queues into the packet processing circuit only the minimum information (for example, a flow ID, a packet length, and a buffer address) for use in the QoS control as a packet pointer (hereinafter simply referred to as "pointer"). In this case, the packets are stored in a large-capacity dynamic random access memory (DRAM) constituted separately from the packet processing circuit. The buffer address is information indicative of a storage location of a packet inside the DRAM that is used as a packet buffer. For example, the buffer address includes an ID of a cell array (hereinafter referred to as "bank") in the DRAM and an address in each bank.

FIG. 21 is a diagram illustrating processing to write and read packets by using pointers. As illustrated in FIG. 21, in QoS control, the packet processing apparatus queues not the packets themselves but only their pointers, and then reads out the pointers in the ascending order from the flow F0 selected by the scheduler SC based on the QoS scheduling result. Further, a read unit reads the packets stored in the addresses based on the buffer addresses indicated by the pointers read out by the scheduler SC.

Patent Document 1: Japanese Laid-open Patent Publication No. 2010-88102 and Patent Document 2: Japanese Laid-open Patent Publication No. 2009-157680 are introduced as the Rerated Art Documents.

It is possible to produce DRAMs with larger capacity and higher speed by forming a plurality of banks therein. However, because of the structure of the DRAMs, successive access to the same bank is made at a specified interval called random cycle time (tRC). Accordingly, it is desirable to execute sequential access to the banks as much as possible so as to demonstrate the maximum access speed of the DRAMs. Hereinafter, such access is referred to as a bank sequential access. While the tRC varies depending on operating frequencies, grades, and types of the DRAMs, the tRC is about ten clk (clock) cycles.

For example, assume the case where a DRAM includes eight banks and tRC=10 clk as illustrated in FIG. 21. In this case, if the packet processing circuit can read or write one pkt (packet) per access, and all the different banks in the DRAM are accessed during ten clk cycles, write or read access of 8 pkt/10 clk can be executed at the maximum. However, when the packet processing circuit successively accesses a plurality of packets stored in the same bank (for example, the bank B0 in FIG. 21) in the DRAM, it is difficult to execute write or read access of about 1 pkt/10 clk since there is a limitation of the above-stated latency time of tRC(=10 clk). Hereinafter, the situation wherein the same bank is successively accessed during the tRC is referred to as "bank conflict."

Here, assume a 100-gigabit Ethernet (registered trademark) for example. In this case, when packets have a shortest length of 64 bytes, the packet processing circuit theoretically needs to process the packets with the packet processing performance of about 150 M pkt/s. Accordingly, when the packet processing apparatus uses a DRAM having an operating frequency of, for example, 300 MHz (number of banks=8, tRC=10 clk), the packet processing circuit needs to process the packets with the processing performance of 1 pkt/2 clk, i.e., 5 pkt/10 clk. Therefore, if the packet processing circuit can uniformly access all the banks as in the bank sequential access, the performance requirement of 5 pkt/10 clk can be fulfilled. However, when the banks are not uniformly accessed, bank arbitration is performed.

FIG. 22 is a diagram illustrating the bank arbitration performed at the time of writing and reading the packets. As illustrated in FIG. 22, when a bank conflict occurs in the bank B1, it is difficult for the packet processing circuit to access the bank B1 and then access again the same bank B1 in a predetermined period of tRC. Accordingly, the packet processing circuit momentarily waits (waits for bank arbitration) in a FIFO (First In First Out) queue, and then access the bank B1 anew. This creates a delay equal to the tRC(=10 clk) between the packets. As a result, the performance of the packet processing apparatus is degraded to less than the above-stated performance requirement (for example, about 1 pkt/10 clk).

The performance requirement of 5 pkt/10 clk can be fulfilled at an access speed of 1 bank/10 clk if the DRAM which operates on a frequency (for example, 1.5 GHz) about five times as large as the current frequency is mounted on the packet processing apparatus. However, this is not feasible. Or an alternative way to avoid the bank conflict is to mount a static random access memory (SRAM) that is a single array memory on the packet processing apparatus as a memory other than the DRAM. However, the SRAM is smaller in capacity than the DRAM, and therefore it is difficult to cover the entire packet buffer with the SRAM in actuality. Mounting a plurality of SRAMs on the packet processing apparatus is not feasible because costs, power consumption, and the number of input-output (IO) pins are increased accordingly.

Accordingly, the packet processing circuit writes the packets to the DRAM in a packet input order in the bank sequential manner, so that the bank conflict at the time of writing is avoidable. FIG. 23 is a diagram illustrating packet processing executable without bank arbitration on the writing side. In FIG. 23, numeric characters in the pointers and packets represent bank IDs. As described in the foregoing, the bank conflict can occur at the time of both packet writing and reading. As illustrated in FIG. 23, the bank conflict at the time of writing is avoidable if the packet processing circuit performs bank-sequential access simply in the input order without taking the flow type into consideration. Therefore, the bank arbitration on the writing side can be omitted.

Contrary to this, the packet output order on the reading side is dependent on the QoS scheduling result. Therefore, bank-sequential access is not performed in some cases and there is a high possibility that the bank conflict occurs. Accordingly, bank arbitration is executed on the reading side as necessary. For example, as illustrated in FIG. 23, when four packets of the flow F0 are uninterruptedly stored in the same bank B0, the scheduler SC reads these four packets from the flow F0 in succession. As a result, the bank conflict occurs three times, and a delay of the tRC(=10 clk) between read packets is generated three times. As a result, the performance of the packet processing apparatus is degraded to less than the above-stated performance requirement (for example, about 1 pkt/10 clk).

SUMMARY

According to an aspect of the embodiments, a packet processing apparatus includes a processor configured to execute a process. The process includes: determining a memory from which packets are read, out of a first memory that stores the packets and a second memory that stores the packets, in accordance with number of pointers indicative of storage locations of the packets in the first memory; and reading the packets stored at the storage locations indicated by the pointers, from the memory determined at the determining.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 8 is a diagram illustrating bank sequential patterns in units of flows;

FIG. 12 is a diagram illustrating skipping which is performed by the scheduler to clear deviation in pointer generated between the DRAM and the SRAM;

FIG. 14B is a diagram illustrating an example in which the same packet is redundantly read as a result of performing parallel writing (copying) without aligning the phases of the pointers;

FIG. 19 is a diagram illustrating a modification in which read buffers are switched in accordance with the number of read pointers in a selected flow;

DESCRIPTION OF EMBODIMENTS

Preferred embodiments will be explained with reference to accompanying drawings. The packet processing apparatus and the packet processing method disclosed in this application are not limited by the following embodiment.

Figure 1:
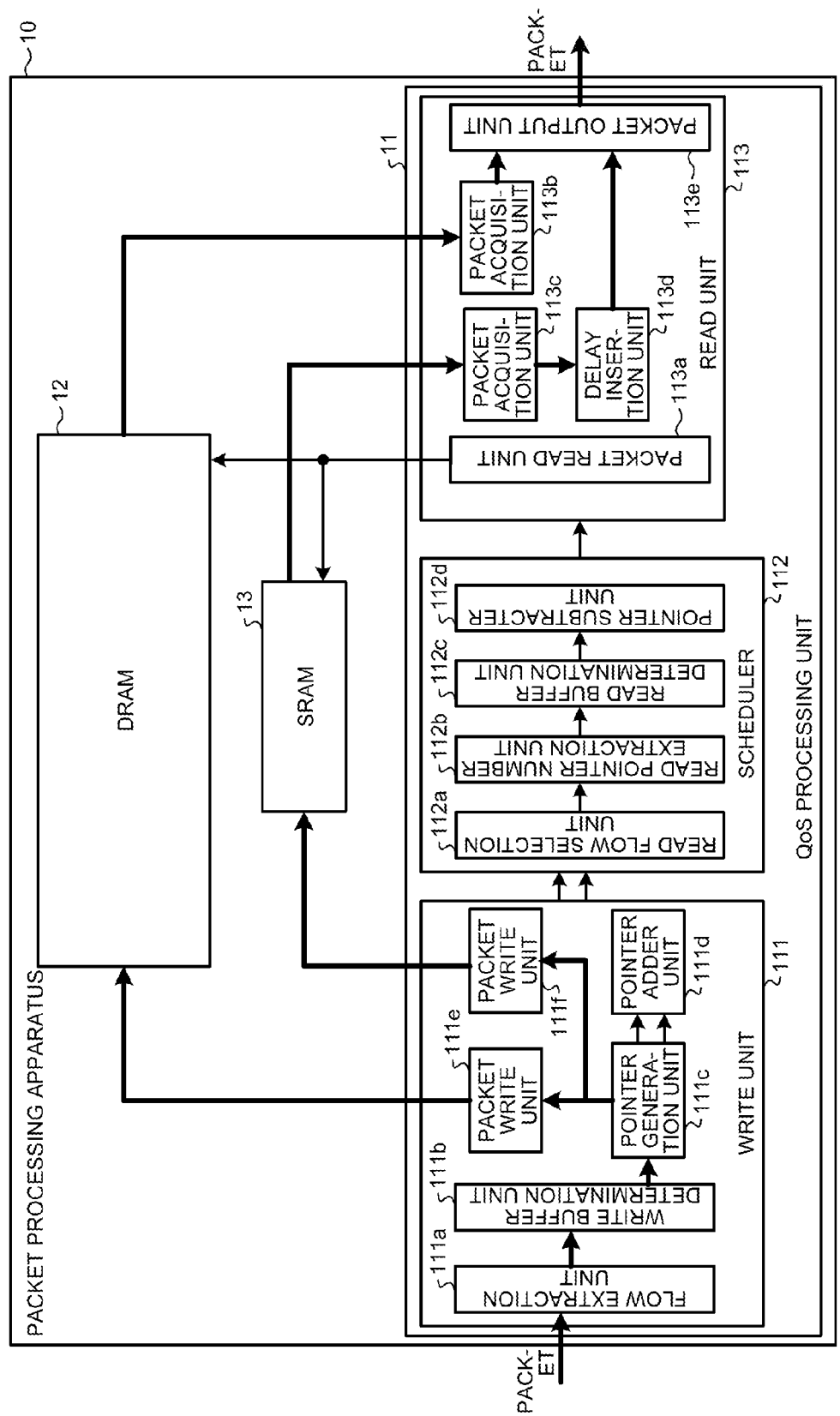
FIG. 1 is a diagram illustrating a function configuration of a packet processing apparatus.

First, the configuration of a packet processing apparatus according to one embodiment disclosed in this application will be described. FIG. 1 is a diagram illustrating the function configuration of a packet processing apparatus 10. As illustrated in FIG. 1, the packet processing apparatus 10 includes a QoS processing unit 11, a DRAM 12, and an SRAM 13. The QoS processing unit 11 reads packets from one of the buffers, the DRAM 12 and SRAM 13, and outputs the read packets to the outside of the apparatus. The QoS processing unit 11 includes a write unit 111, a scheduler 112, and a read unit 113.

The write unit 111 includes a flow extraction unit 111a, a write buffer determination unit 111b, a pointer generation unit 111c, a pointer adder unit 111d, a packet write unit 111e, and a packet write unit 111f. These respective component members are connected in one way or two-way direction so that signals and data can be inputted and outputted. The flow extraction unit 111a identifies respective flows of input packets, and determines which queue the packets are queued in. The write buffer determination unit 111b determines whether to write the input packets in both the buffers, or only in the DRAM 12. The pointer generation unit 111c generates pointers representative of the input packets. The pointer adder unit 111d increments the pointer length in the buffer to which write access has been made. The packet write unit 111e writes the input packets to the DRAM 12. The packet write unit 111f writes the input packets to the SRAM 13.

The scheduler 112 includes a read flow selection unit 112a, a read pointer number extraction unit 112b, a read buffer determination unit 112c, and a pointer subtracter unit 112d. These respective component members are connected in one way or two-way direction so that signals and data can be inputted and outputted. The read flow selection unit 112a selects a flow from which the packets are read in accordance with bandwidth control and/or priority control. The read pointer number extraction unit 112b extracts the number of read pointers indicative of the number of readable packets from the selected flow based on the result of the bandwidth control and/or priority control. The read buffer determination unit 112c determines which buffer, the DRAM 12 or the SRAMs 13, the packets are read from. For example, when the pointer length in the DRAM 12 is five or more or when the SRAM 13 is empty in the selected flow, the read buffer determination unit 112c determines the DRAM 12 as the read buffer. In other cases, the read buffer determination unit 112c determines the SRAM 13 as the read buffer. The pointer subtracter unit 112d decrements the pointer length in both the buffers by the number of pointers corresponding to the read packets.

The read unit 113 includes a packet read unit 113a, a packet acquisition unit 113b, a packet acquisition unit 113c, a delay insertion unit 113d, and a packet output unit 113e. These respective component members are connected in one way or two-way direction so that signals and data can be inputted and outputted. The packet read unit 113a refers to buffer addresses indicated by the pointers and reads the packets stored in the addresses from the DRAM 12 or the SRAM 13. The packet acquisition unit 113b acquires the packets read from the DRAM 12. The packet acquisition unit 113c acquires the packets read from the SRAM 13. The delay insertion unit 113d inserts fixed delay (latency) to the packets acquired from the SRAM 13. The packet output unit 113e unites the packets inputted from the packet acquisition unit 113b and the delay insertion unit 113d, and outputs the packets in an input order to the outside of the apparatus.

The DRAM 12 is a main packet buffer, which has a plurality of memory cell arrays (for example, eight banks). The SRAM 13 is a sub packet buffer, which has a single memory cell array.

Figure 2:
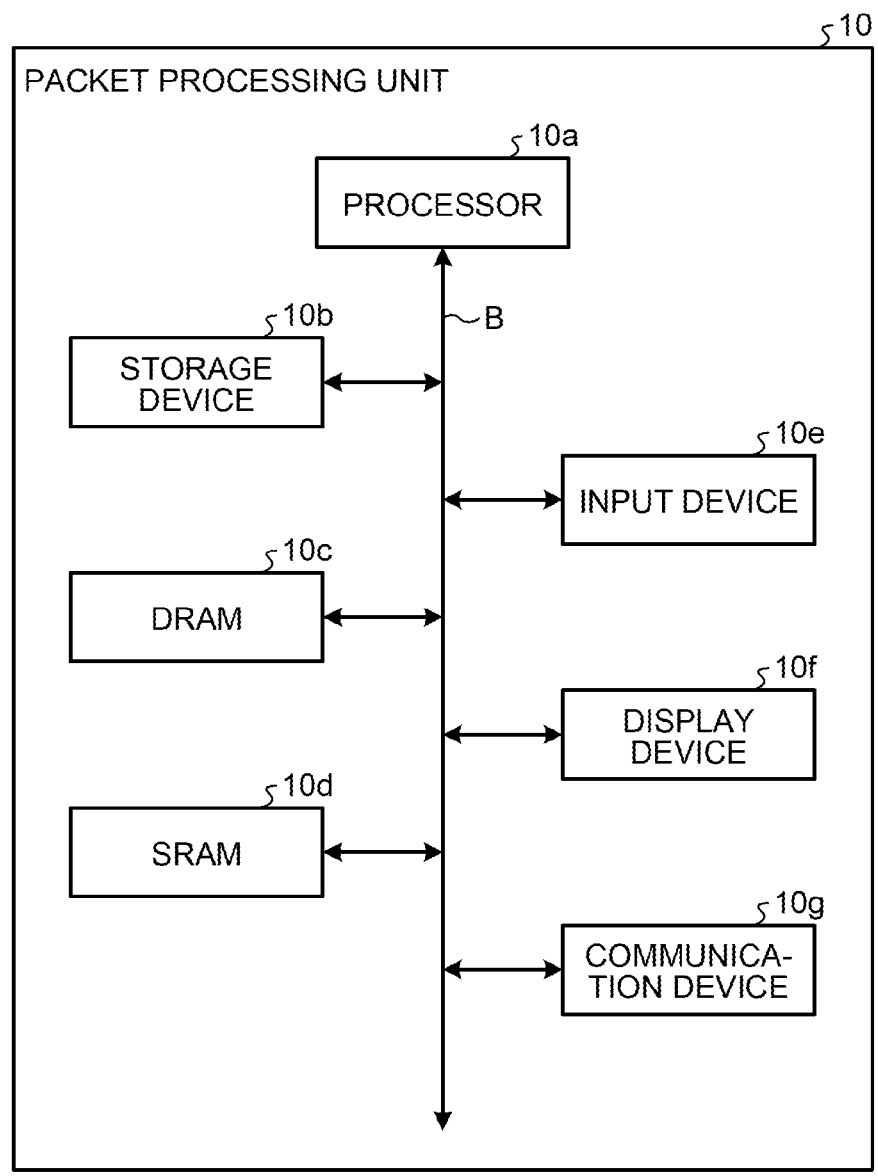
FIG. 2 is a diagram illustrating a hardware configuration of the packet processing apparatus.

Next, the hardware configuration of the packet processing apparatus 10 will be described. FIG. 2 is a diagram illustrating the hardware configuration of the packet processing apparatus 10. As illustrated in FIG. 2, the packet processing apparatus 10 includes a processor 10a, a storage device 10b, a DRAM 10c, an SRAM 10d, an input device 10e, a display device 10f, and a communication device 10g, which are connected via a bus B so that various signals and data can be inputted and outputted. Examples of the processor 10a may include the aforementioned FPGA, ASIC, and NPU, as well as a central processing unit (CPU) and a digital signal processor (DSP). Examples of the storage device 10b may include nonvolatile storage devices such as hard disks (HDs), read only memories (ROMs), and flash memories. Examples of the input device 10e may include keyboards, mouses, and touch panels. Examples of the display device 10f may include liquid crystal displays (LCDs) and electro luminescence displays (ELDs). Examples of the communication device 10g may include network (NW) boards.

From the viewpoint of the correspondence relation between the function configuration and the hardware configuration, the QoS processing unit 11, among the functional component members of the packet processing apparatus 10 illustrated in FIG. 1, is implemented by the processor 10a and the storage device 10b, for example. The DRAM 12 is implemented by, for example, the DRAM 10c, and the SRAM 13 is implemented by, for example, the SRAM 10d.

A description will now be given of the operation of the packet processing apparatus 10.

Figure 3:
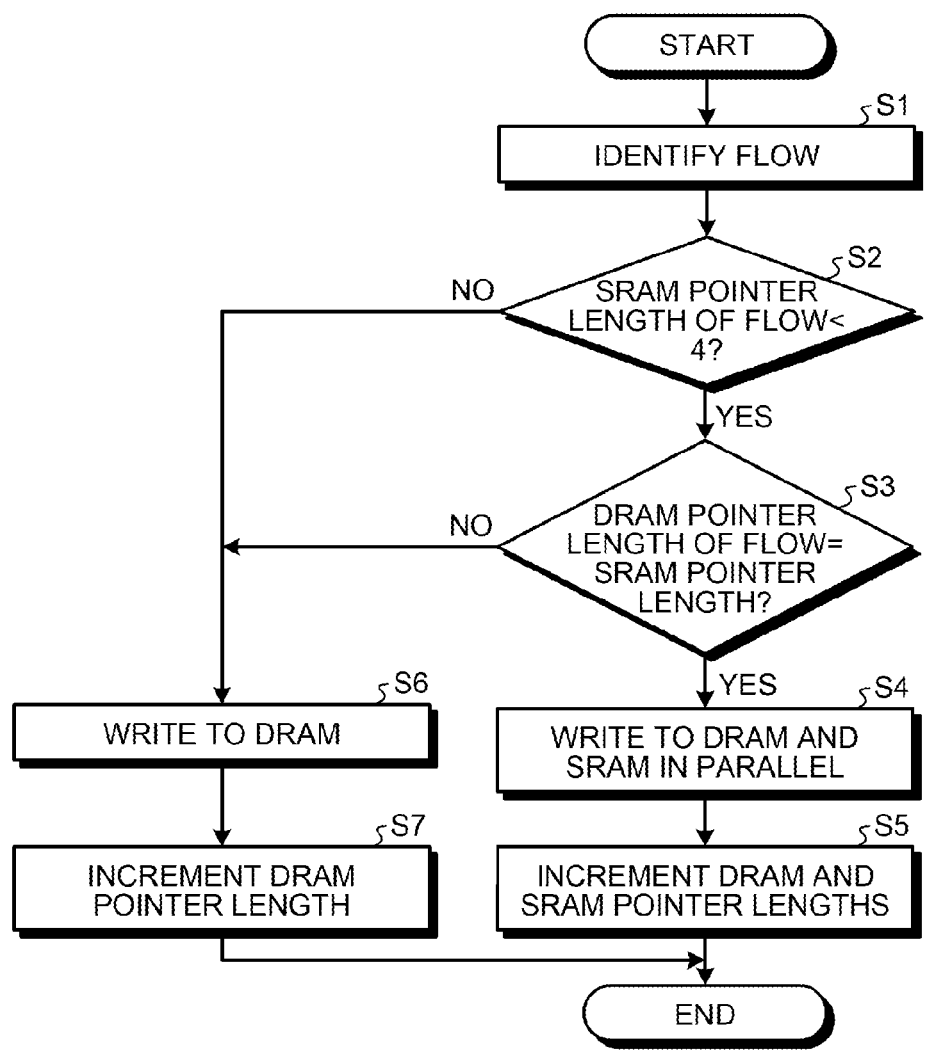
FIG. 3 is a flow chart illustrating write processing executed by a write unit.

FIG. 3 is a flow chart illustrating write processing executed by the write unit 111. First in step S1, once a packet reaches the packet processing apparatus 10, the flow extraction unit 111a identifies a flow of the packet based on a flow ID of the packet. Next, the write buffer determination unit 111b determines whether or not a pointer length in the SRAM 13 in the flow identified in step S1 is less than four (step S2). If the pointer length is less than four as a result of the determination (Yes in step S2), the write buffer determination unit 111b determines whether or not the pointer length in the DRAM 12 in the flow identified in step S1 is identical to the pointer length in the SRAM 13 (step S3). If the respective pointer lengths are identical as a result of the determination (Yes in step S3), the packet write unit 111e and the packet write unit 111f store the packet in the DRAM 12 and the SRAM 13 in parallel (step S4), respectively. In step S5, the pointer adder unit 111d increments the pointer length in both the DRAM 12 and the SRAM 13.

If the pointer length is four as a result of the determination in step S2 (No in step S2), or if the respective pointer lengths are different from each other as a result of the determination in step S3 (No in step S3), the processing shifts to step S6 and following steps. In step S6, the packet write unit 111e stores the packet in the DRAM 12. The pointer adder unit 111d then increments the pointer length in the DRAM 12 (step S7).

Figure 4:
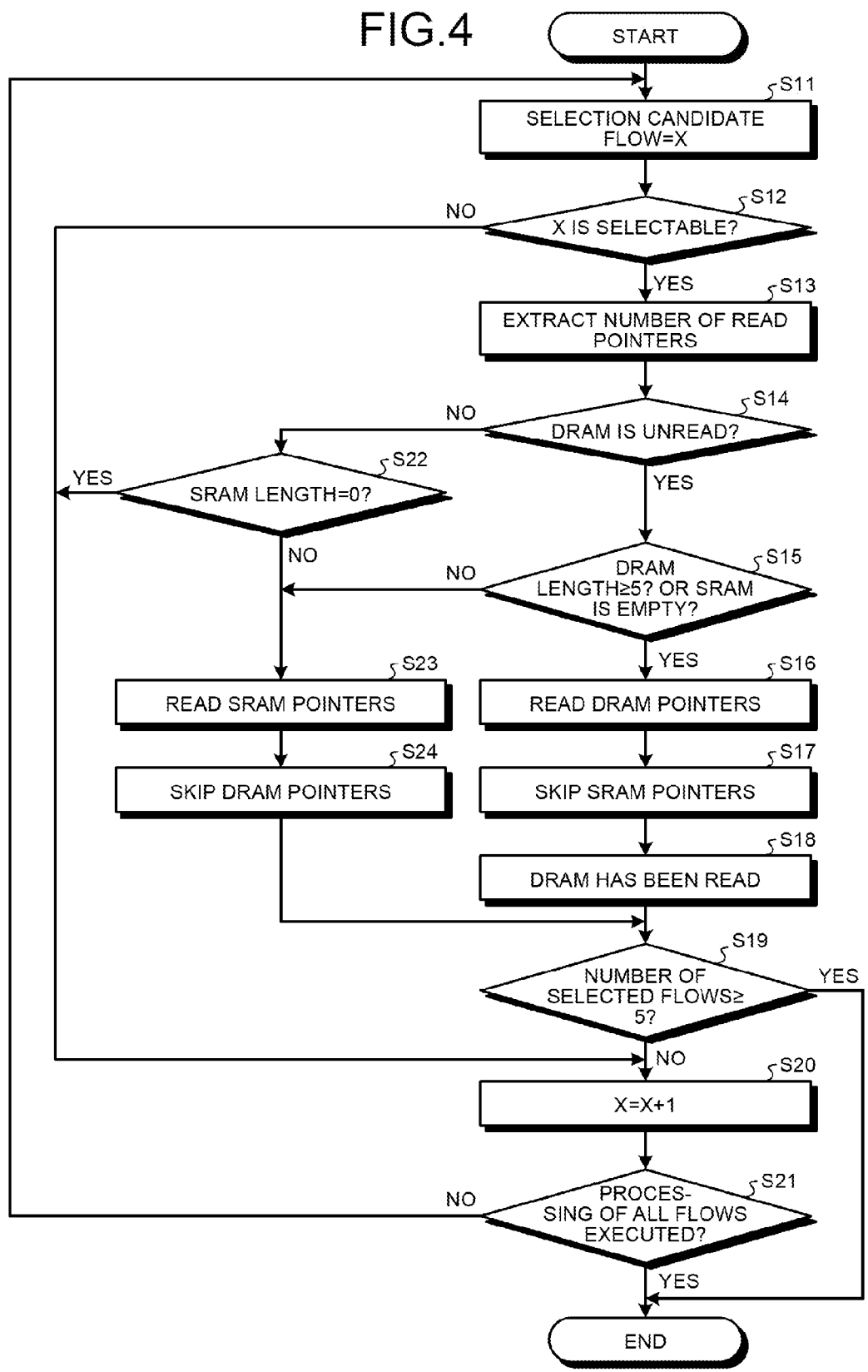
FIG. 4 is a flow chart illustrating scheduling processing executed by a scheduler.

FIG. 4 is a flow chart illustrating scheduling processing executed by the scheduler 112. First in step S11, the read flow selection unit 112a sets "X" as a selection candidate flow ID. The read flow selection unit 112a then determines whether or not "X" is selectable based on the presence of the stored pointers, and the propriety of the bandwidth control processing (shaping) based on a contract (step S12). If "X" is selectable as a result of the determination (Yes in step S12), the read pointer number extraction unit 112b extracts the number of read pointers based on the result of the bandwidth control and/or the priority control (step S13).

In step S14, the read buffer determination unit 112c determines whether or not the DRAM 12 is unread. If the DRAM 12 is unread as a result of the determination (Yes in step S14), the read buffer determination unit 112c determines whether or not the pointer length in the DRAM 12 is five or more and whether or not the SRAM 13 is empty for the flow ID "X" (step S15). If at least one of the conditions is satisfied as a result of the determination (Yes in step S15), the pointer subtracter unit 112d reads the pointers in the DRAM 12 from its queue (step S16). In this case, the pointer subtracter unit 112d also skips the pointers in the SRAM 13 (step S17). As a result, the DRAM 12 is in a state where the packets have been read (step S18).

In step S19, the read flow selection unit 112a determines whether or not the total number of the selected flows is "five" or more. If the total number is not "five" or more (No in step S19), the flow ID "X" set in step S11 is incremented by one (step S20). In step S21, the read flow selection unit 112a determines whether or not the processing of all the flows has been performed, i.e., whether or not a series of aforementioned processing has been performed on all the flows subjected to scheduling. If the processing of all the flows has been executed (Yes in step S21) as a result of the determination, a series of processing is ended. If the processing of all the flows is not yet executed (No in step S21), the processing in step S11 and following steps is executed again.

In step S14, if the DRAM 12 is not unread (No in step S14), the read buffer determination unit 112c determines whether or not the pointer length in the SRAM 13 for the flow ID "X" is zero (step S22). If the pointer length of the SRAM 13 is not zero as a result of the determination (No in step S22), the pointer subtracter unit 112d reads pointers in the SRAM 13 from its queue (step S23) contrary to step S16. In this case, the pointer subtracter unit 112d also skips the pointers in the DRAM 12 (step S24). After that, the processing shifts to step S19 and following steps.

If "X" is not selectable in step S12 (No in step S12), or if the pointer length of the SRAM 13 is zero in step S22 (Yes in step S22), the packet processing apparatus 10 omits subsequent processing, and shifts to processing of step S20. If no condition is satisfied in step S15 (No in step S15), the processing of step S23 and following steps is executed. If the total number of the selected flows is "five" or more in step S19 (Yes in step S19), the packet processing apparatus 10 omits the aforementioned processing of step S20 and step S21, and ends a series of processing.

Figure 5:
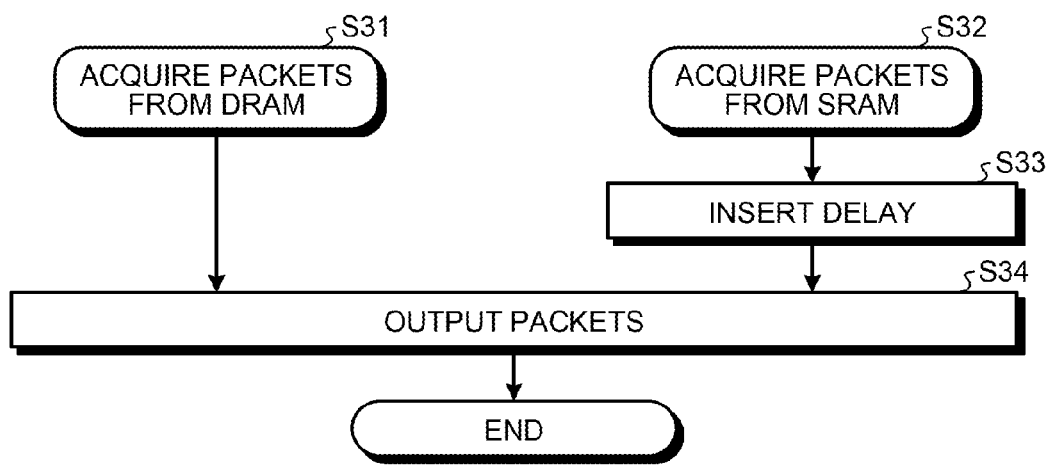
FIG. 5 is a flow chart illustrating read processing executed by a read unit.

FIG. 5 is a flow chart illustrating read processing executed by the read unit 113. First in step S31, the packet acquisition unit 113b acquires the packets read from the DRAM 12 based on the buffer addresses indicated by the pointers. Similarly, in step S32, the packet acquisition unit 113c acquires the packets read from the SRAM 13 based on the buffer addresses indicated by the pointers. Then, the delay insertion unit 113d inserts fixed delay (latency) to the packets acquired from the SRAM 13 (step S33). In step S34, the packet output unit 113e unites the packets inputted from the packet acquisition unit 113b and the delay insertion unit 113d, and outputs the packets in an input order to the outside of the apparatus.

Figure 6:
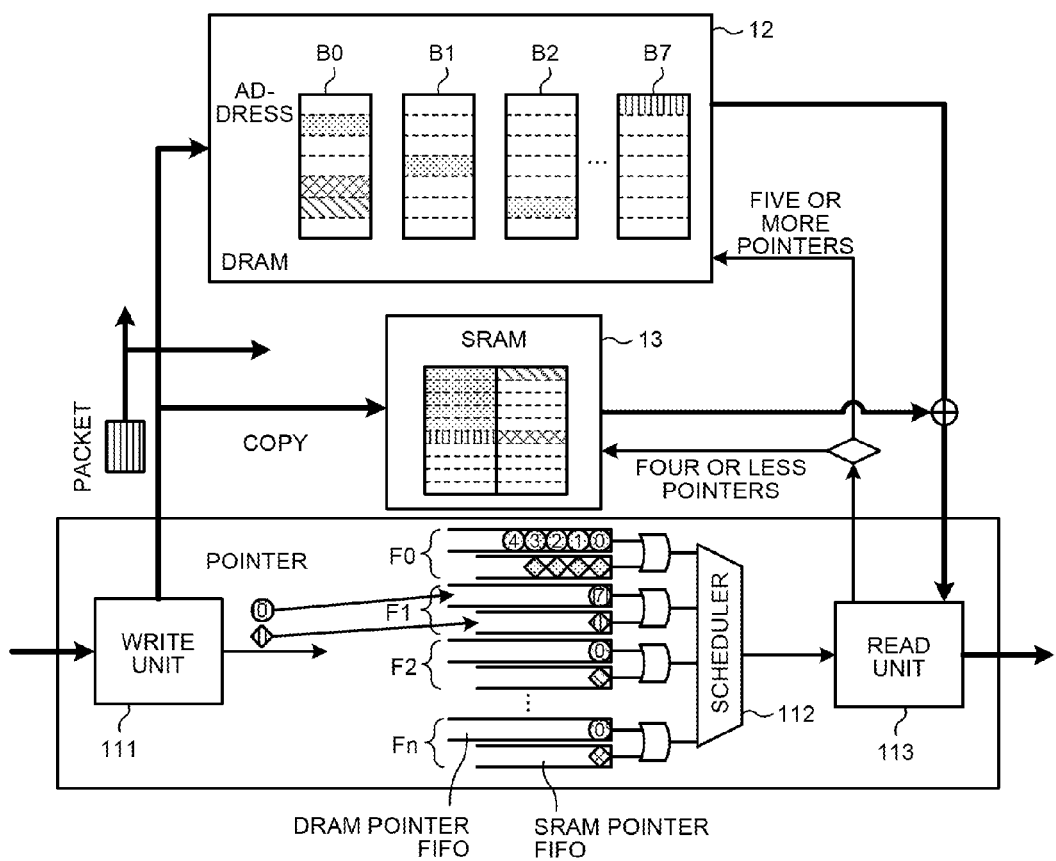
FIG. 6 is a diagram illustrating read buffers which are switched in accordance with the number of read pointers in a selected flow in an embodiment.

Hereinafter, the operation of the packet processing apparatus 10 will be described more in detail with reference to FIGS. 6 to 19. FIG. 6 is a diagram illustrating read buffers which are switched in accordance with the number of read pointers in a selected flow in the embodiment. In FIG. 6, the numeric characters in the pointers correspond to bank numbers. For example, when the numeric character in a pointer is "0," the packet indicated by the pointer is stored in the bank B0 of the DRAM 12. As illustrated in FIG. 6, the packet processing apparatus 10 performs parallel writing (copying) to the DRAM 12 and the SRAM 13. Specifically, the write unit 111 writes packets to the DRAM 12 in units of flows in the bank sequential manner.

For example, when the write unit 111 writes nine packets of the flow F0 to the DRAM 12, the write unit 111 writes the packets while incrementing the bank number of the writing destination. That is, the first packet is written to the bank B0, the second packet is written to the bank B1, and the third packet is written to the bank B2. This prevents bank conflict in units of flows. When the number of read pointers per flow is five or more, the packet processing apparatus 10 can fulfill the performance requirement of 5 pkt/10 clk. Here, the performance is expressed by the number of packets that the packet processing apparatus 10 can read per unit time (for example, 10 clk cycles). For example, when five packets are readable per 10 clk cycles, the performance of the packet processing apparatus 10 is "5 pkt/10 clk."

The SRAM 13 can store packets equivalent to four pointers for each flow. Accordingly, when the number of read pointers is four or less, the packet processing apparatus 10 reads the packets from the SRAM 13. More specifically, after the scheduler 112 selects a read flow, the packet processing apparatus 10 reads packets from one of the DRAM 12 and the SRAM 13 in accordance with the number of read pointers of the flow.

Figure 7:
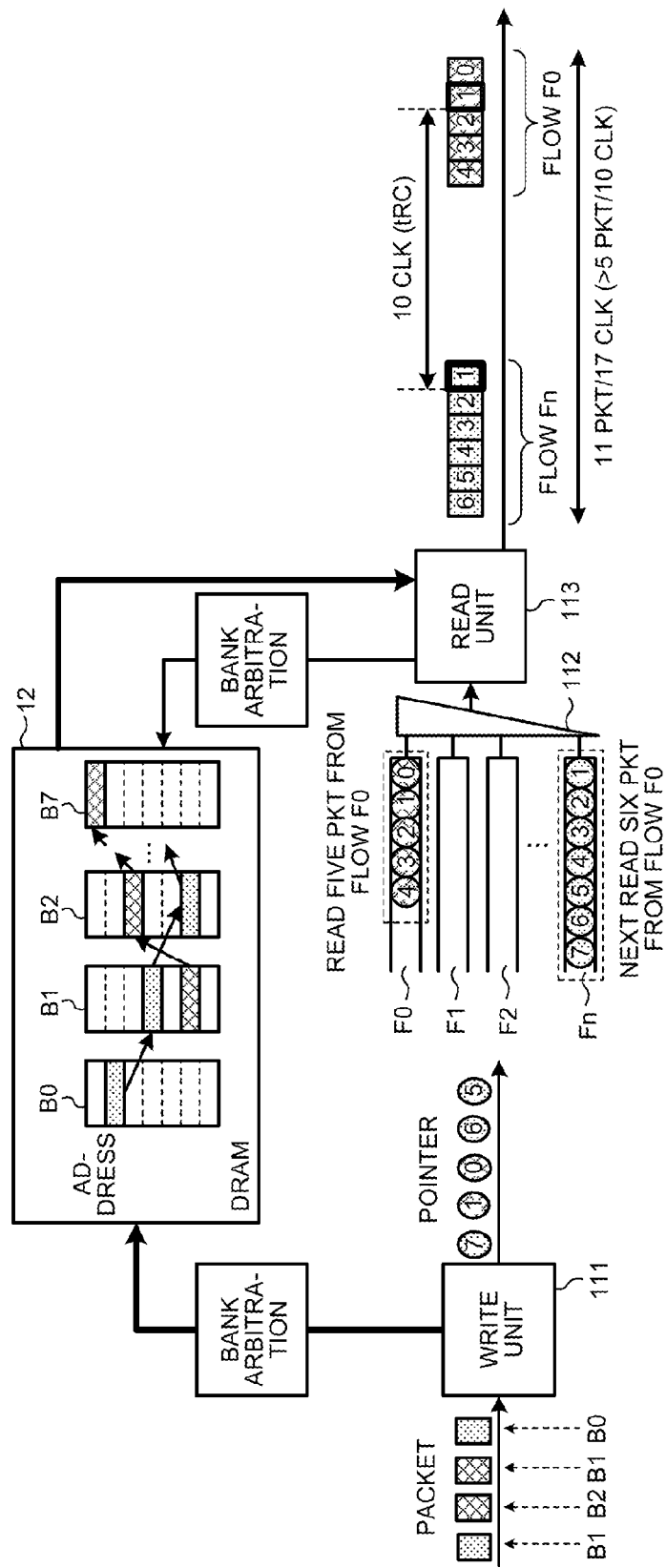
FIG. 7 is a diagram illustrating that a performance requirement is fulfilled when the flow having five or more read pointers is selected.

FIG. 7 is a diagram illustrating that the performance requirement is fulfilled when the flow having five or more read pointers is selected. In FIG. 7, the numeric characters in the pointers correspond to bank numbers. For example, when the numeric character in a pointer is "3," the packet indicated by the pointer is stored in the bank B3 of the DRAM 12. FIG. 7 illustrates bank sequential writing performed in units of flows. In this case, when five or more pointers are contained in each of the flows F0 and Fn, the conflict occurs in the bank B1. However, even when the apparatus waits for ten clk cycles before making a next read access to the bank B1, the performance requirement is still fulfilled. More specifically, during 17 clk cycles, all five packets are readable from the queue of the flow F0 and six packets are readable from the queue of the flow Fn (which contains 7 packets). Accordingly, the performance of the packet processing apparatus 10 is 11 pkt/17 clk, so that the performance requirement of 5 pkt/10 clk can be fulfilled.

As described in the foregoing, the writing order is always equal to the reading order in units of flows. Accordingly, when the packet processing apparatus 10 reads the flows (F0, Fn) selected based on QoS scheduling at the rate of 1 flow/10 clk as illustrated in FIG. 7, the performance of the packet processing apparatus 10 surpasses the performance requirement of 5 pkt/10 clk. Therefore, if the packet processing apparatus 10 can read, for example, eight pointers from each of the flows F0 and Fn, the packet processing apparatus 10 can fulfill a higher performance requirement of 8 pkt/10 clk.

Here, the bank sequential writing in units of flows may be performed with patterns unique for the respective flows. FIG. 8 is a diagram illustrating bank sequential patterns in units of flows. As illustrated in FIG. 8, the bank sequential patterns may be in the order other than the ascending order as in the flow F0. For example, patterns such as "1, 3, 5, 7, 0, 2, 4, 6" may be used wherein the numbers do not overlap with each other in units of flows. The arrangement of the bank numbers may vary among the flows. More specifically, the packets may be stored in the bank order unique for each of the flows F0 to Fn as illustrated in FIG. 8.

For example, assume the case where all the flows F0 to Fn have an identical sequential pattern of "0, 1, 2, 3, 4, 5, 6, 7" as in the flow F0. In this case, when the input timings of the respective flows F0 to Fn are coincided, the bank conflict in writing frequently occurs. For example, when the packet processing apparatus 10 inputs packets while incrementing the flow number of each packet, the packets of all the flows are written to the bank B0, and then the packets of all the flows are written to the bank B1. Then, the packets of all the flows are written to the bank B2, and the packets of all the flows are written to the bank B3. In this manner, the bank conflict frequently occurs in writing of packets to each of the banks B0 to B7. Accordingly, as illustrated in FIG. 8, the packet processing apparatus 10 appropriately changes the sequential patterns so as to distribute the banks used in writing among the flows and to thereby reduce the frequency of the bank conflict.

The bank sequential patterns may be recorded on a randomization table included in the storage device 10b, and the packet processing apparatus 10 may refer to these patterns in the table at the time of writing. Or the packet processing apparatus 10 may have a pseudorandom generation circuit, such as a pseudorandom numbers (PN) circuit, which is used to perform calculation to assign unique sequential patterns to the respective flows F0 to Fn at the time of packet writing.

Even when the bank sequential writing is performed, it is difficult to completely avoid the bank conflict in writing as illustrated in FIG. 7. However, since the packet processing apparatus 10 performs read access to the selected flow at the rate of 5 pkt/10 clk or more, the performance requirement is fulfilled. However, in the case where the packets can be read from the selected flow only at the rate of 4 pkt/10 clk or less, the packet processing apparatus 10 needs to select a plurality of flows and to read the packets from the selected flows during ten clk cycles in order to fulfill the performance requirement.

Figure 9:
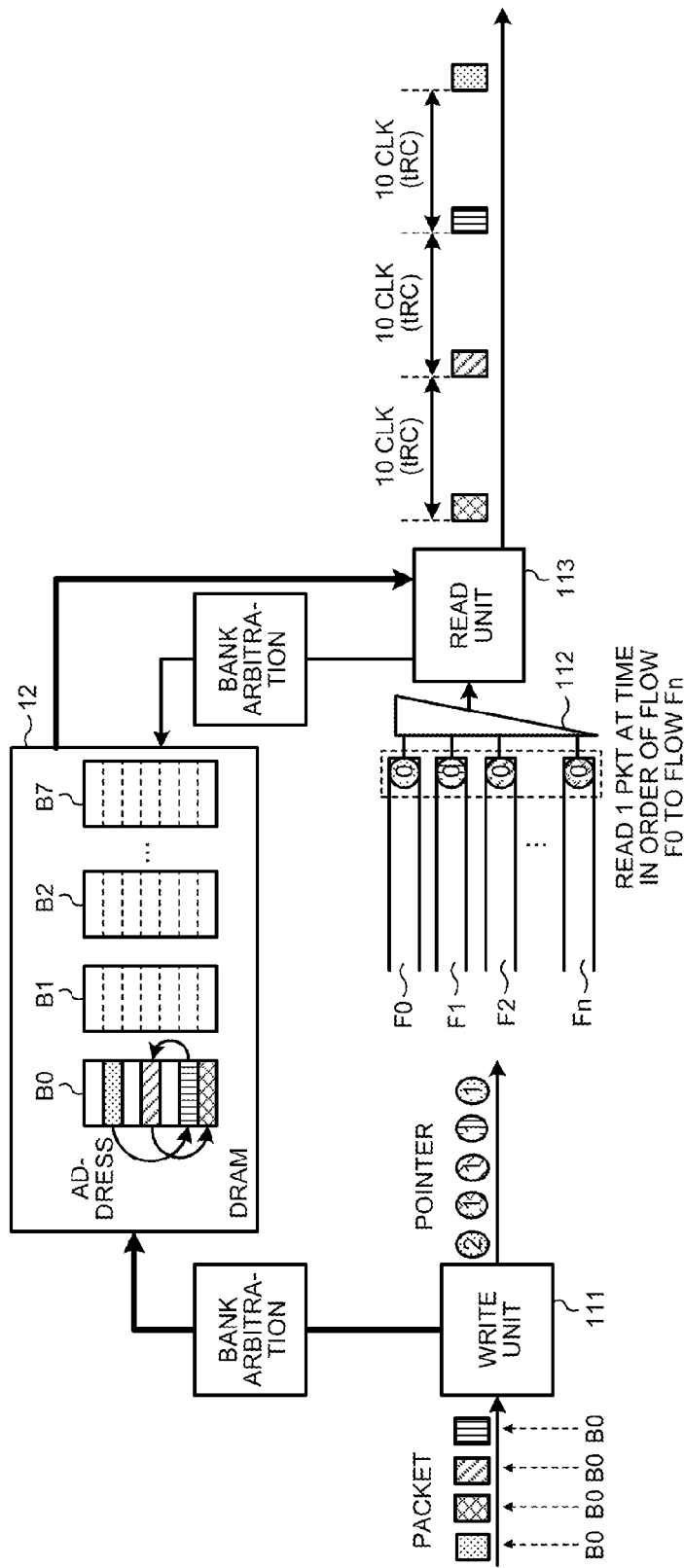
FIG. 9 is a diagram illustrating a case where the performance requirement is not fulfilled in reading of packets since an SRAM is not used.

FIG. 9 is a diagram illustrating the case where the performance requirement is not fulfilled in reading of packets since the SRAM 13 is not used. In FIG. 9, the numeric characters in the pointers correspond to bank numbers. For example, when the numeric character in a pointer is "0," the packet indicated by the pointer is stored in the bank B0 of the DRAM 12. Even when the scheduler 112 of the packet processing apparatus 10 selects a plurality of flows (for example, four flows) during ten clk cycles as illustrated in FIG. 9, each of the flows F0, F1, F2 and Fn may have only one pkt and all these packets may be stored in the same bank B0. In this case, the bank conflict occurs in the bank B0 in reading these packets. As a result, it takes 30 clk (=10 clk×3) cycles to complete reading of four packets from the bank B0 in the DRAM 12. Since 4 pkt/30 clk<5 pkt/10 clk, the packet processing apparatus 10 fails to fulfill the performance requirement in this case.

Accordingly, the packet processing apparatus 10 reads the packets in the flows which only have four pointers in their queues, not from the DRAM 12 but from the SRAM 13 which is free from the bank conflict. As a result, the packet processing apparatus 10 achieves suppression of the packet processing delay caused by the bank conflict. When the performance requirement is 5 pkt/10 clk, the SRAM 13 may preferably have a capacity that enables four (=5−1) packets to be stored per flow.

However, when the packet processing apparatus 10 uses not only the DRAM 12, but also the SRAM 13 in addition to the DRAM 12, there are concerns that the packet reading order may be reversed and/or packets may be redundantly read out. Accordingly, at the time of writing the packets with the write unit 111, the packet processing apparatus 10 performs parallel writing (copying) to the DRAM 12 and the SRAM 13 while aligning the pointers (phases) of the respective flows. After that, the packet processing apparatus 10 reads the packets from one of the buffers, the DRAM 12 or the SRAM 13, with the read unit 113 in accordance with the number of read pointers of the selected flow.

Figure 10:
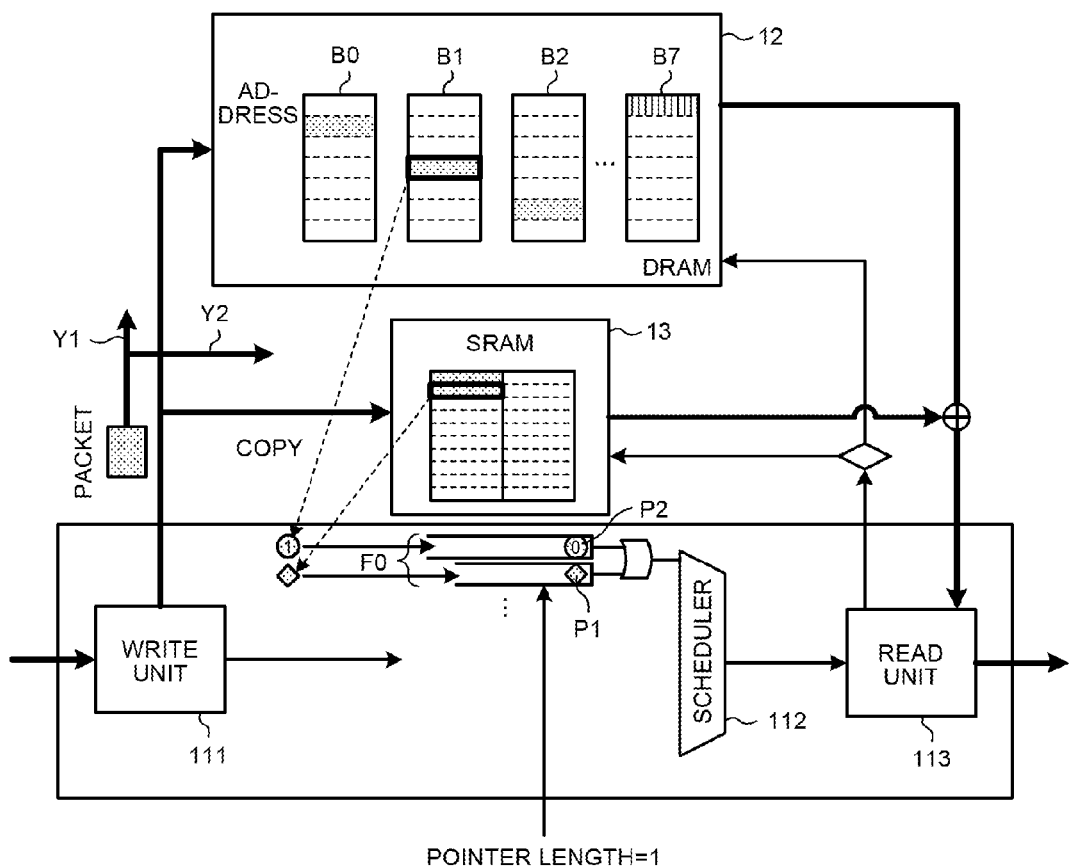
FIG. 10 is a diagram illustrating conditions under which the write unit of the packet processing apparatus writes (copies) packets to the DRAM and the SRAM in parallel.

FIG. 10 is a diagram illustrating conditions on which the write unit 111 of the packet processing apparatus 10 writes (copies) packets to the DRAM 12 and the SRAM 13 in parallel. In FIG. 10, the numeric characters in the pointers correspond to bank numbers. For example, when the numeric character in a pointer is "1," the packet indicated by the pointer is stored in the bank B1 of the DRAM 12. The packet processing apparatus 10 holds a DRAM pointer length and an SRAM pointer length in the DRAM 10c so that they are incrementable in units of flows. For example, in the example illustrated in FIG. 10, one pointer is stocked in each of the queues of the flow F0, the queues corresponding to the respective buffers (DRAM 12, SRAM 13), in the scheduler 112. Therefore, "1" is held as both the DRAM pointer length and the SRAM pointer length.

The write unit 111 of the packet processing apparatus 10 performs parallel writing of the packet to the DRAM 12 and the SRAM 13 if the conditions of "SRAM pointer length <4 and DRAM pointer length=SRAM pointer length" are met. These conditions are applied to the case where the SRAM 13 can store up to 4 pkt/flow. For example, in the case where the SRAM 13 can store up to N packets (N being natural numbers) per flow, the above conditions are changed to "SRAM pointer length <N, and DRAM pointer length=SRAM pointer length."

For example, in the example illustrated in FIG. 10, only a pointer P1 corresponding to the bank B0 is stored as an SRAM pointer in the queue of the flow F0 in the scheduler 112. Accordingly, the SRAM pointer length=1, and therefore the condition of SRAM pointer length <4 is satisfied. Similarly, only a pointer P2 corresponding to the bank B0 is stored as a DRAM pointer in the queue of the flow F0. Accordingly, the DRAM pointer length=1, and therefore the condition of DRAM pointer length=SRAM pointer length is also satisfied. Therefore, the above-stated conditions are fulfilled.

Therefore, as illustrated by arrows Y1 and Y2, the write unit 111 of the packet processing apparatus 10 executes parallel writing of a subsequent packed. Hereinafter, when a new packet is inputted into the write unit 111, the parallel writing of the packet to the DRAM 12 and the SRAM 13 is executed as long as the conditions are fulfilled. As a result, the same packets are sequentially written to the DRAM 12 and the SRAM 13 while their pointers (phases) are aligned in each flow. Therefore, with simple configuration, the packet processing apparatus 10 can prevent the packets from being read out in reversed order or being redundantly read out, without performing complicated processing such as sequence control involving sequence number (SN). As a result, the reliability of the packet processing apparatus 10 is enhanced.

Figure 11A:
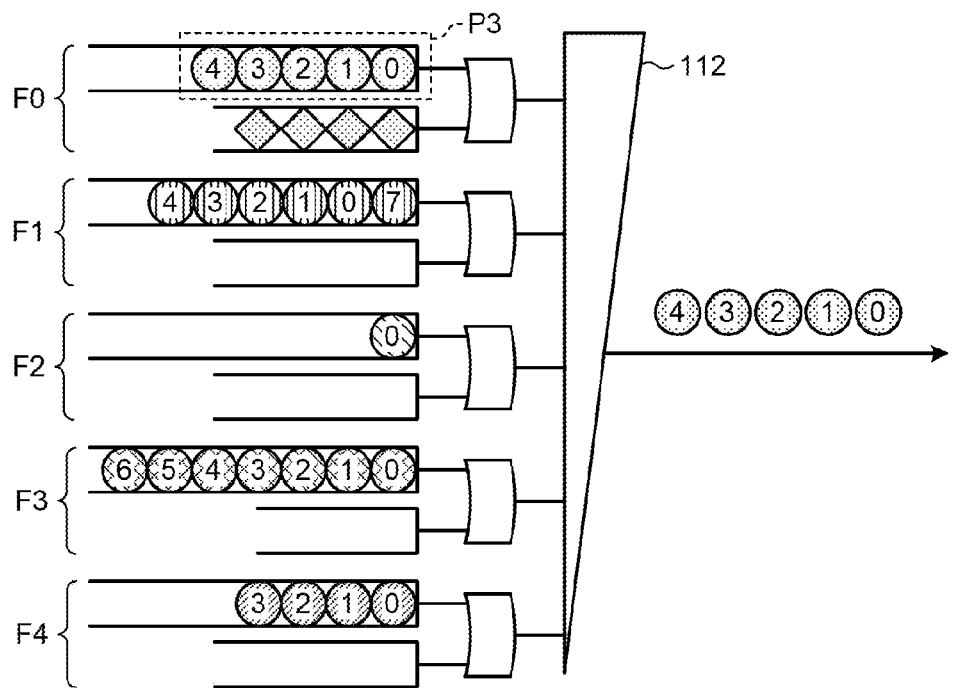
FIG. 11A is a diagram illustrating pointers when the read unit of the packet processing apparatus reads packets from the DRAM.

FIG. 11A is a diagram illustrating the pointers when the read unit 113 of the packet processing apparatus 10 reads packets from the DRAM 12. In FIG. 11, the numeric characters in the pointers correspond to bank numbers. For example, when the numeric character in a pointer is "3," the packet indicated by the pointer is stored in the bank B3 of the DRAM 12. Which buffer, the DRAM 12 or the SRAM 13, the packets are read from is determined based on whether or not the condition of "DRAM pointer length ≥5 or the SRAM 13 is empty" is fulfilled in the selected flow as described before. If the above conditions are fulfilled, the packets of the selected flow is read from the DRAM 12, whereas if the conditions are not fulfilled, the packets are read from the SRAM 13.

In the example illustrated in FIG. 11A, five DRAM pointers are contained in the queue of the flow F0 as indicated by a DRAM pointer P3. Accordingly, the condition of DRAM pointer length ≥5 is satisfied, and therefore, the packets of the flow F0 are read from the DRAM 12. In this case, when the packets of a plurality of flows are read from the DRAM 12, the bank conflict occurs, and this hinders the read unit 113 from reading the packets of other flows from the DRAM 12 during ten clk cycles. However, since five or more pointers are already contained in the flow (flow F0 in FIG. 11A) from which the packets are to be read, the read unit 113 can read five or more packets from one flow. Therefore, the packet processing apparatus 10 can fulfill the performance requirement of 5 pkt/10 clk.

Figure 11B:
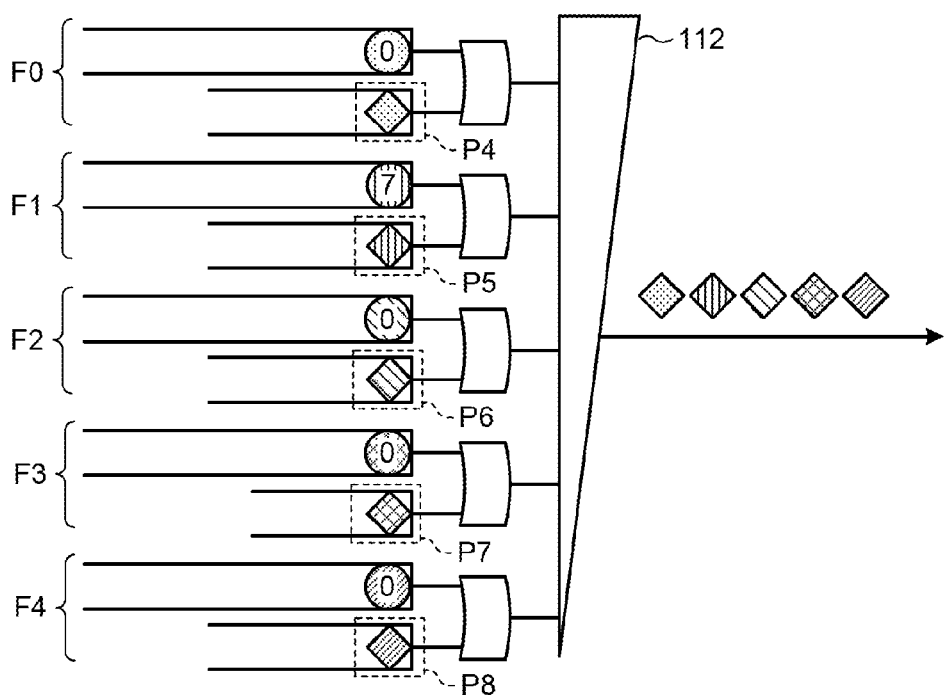
FIG. 11B is a diagram illustrating the pointers when the read unit of the packet processing apparatus reads packets from the SRAM.

FIG. 11B is a diagram illustrating the pointers when the read unit 113 of the packet processing apparatus 10 reads packets from the SRAM 13. In FIG. 11B, the numeric characters in the pointers correspond to bank numbers. For example, when the numeric character in a pointer is "0," the packet indicated by the pointer is stored in the bank B0 of the DRAM 12. In the example illustrated in FIG. 11B, one SRAM pointer is contained in each of the queues of the respective flows F0 to F4 as indicated by the SRAM pointers P4 to p8. Accordingly, the condition of DRAM pointer length ≥5 is not satisfied. Moreover, since the SRAM pointer is present, the condition that the SRAM 13 is empty is not satisfied either. Therefore, the packets of the respective flows F0 to F4 are read from the SRAM 13. In the SRAM 13, the bank conflict does not occur even when the packets of a plurality of flows are read out. Accordingly, the read unit 113 can read total five packets from the respective flows F0 to F4 during ten clk cycles, and therefore, the packet processing apparatus 10 can fulfill the performance requirement of 5 pkt/10 clk. That is, the packet processing apparatus 10 can constantly demonstrate the performance which exceeds the performance requirement, irrespective of whether or not the determination conditions are satisfied.

Here, when reading is performed only from one packet buffer, deviation in pointer (phase) between the DRAM pointers and the SRAM pointers may be generated. However, in the packet processing apparatus 10, this deviation problem can be solved not by actually reading the pointers in the buffer which has not been read-accessed, but by incrementing (hereinafter referred to as "skipping") the read address of these pointers by the number of pointers in the other buffer which has actually been read. For example, when the read unit 113 reads three packets from the SRAM 13, three SRAM pointers are also read from the queue. In response to this, the scheduler 112 skips the same number of pointers, that is, three pointers in the DRAM. Thus, the packet processing apparatus 10 clears the deviation in pointer generated between the respective buffers.

FIG. 12 is a diagram illustrating skipping which is performed by the scheduler 112 to clear the deviation in pointer generated between the DRAM and the SRAM. As illustrated in FIG. 12, when one SRAM pointer of a certain flow is read, the corresponding pointer on the DRAM side is not read, but address increment is performed to skip the pointer equal in number (one pointer) to the SRAM side. Similarly, when two SRAM pointers are read, the corresponding pointers are not actually read on the DRAM side, but address increment is performed to skip the pointers equal in number (two pointers) to the SRAM side. In these cases, the queues in both the DRAM 12 and the SRAM 13 become empty.

Next, assume the case where four pointers are contained in the queues but only three out of four SRAM pointers are read in response to a command from the scheduler 112. In this case, the scheduler 112 skips three pointers on the DRAM side. As a result, one pointer is left in both the queues of the DRAM 12 and the SRAM 13. In this case, the phases of the pointers are aligned (synchronized) as indicated by the pointer P9. Accordingly, in the subsequent reading of the packets, the reading orders are not reversed and/or packets are not redundantly read no matter which buffer the packets are read from.

When five DRAM pointers and four SRAM pointers are contained in the queues, reading the packets corresponding to five pointers from the DRAM 12 causes shortage of SRAM pointers to be read on the SRAM side. That is, reading of the SRAM pointer is further tried after the queue is void of the SRAM pointers. In this case, the scheduler 112 skips not five pointers but up to four pointers on the SRAM side, irrespective of the number of read pointers (five) on the DRAM side. As a result, deviation in pointer phase is avoided.

Figure 13:
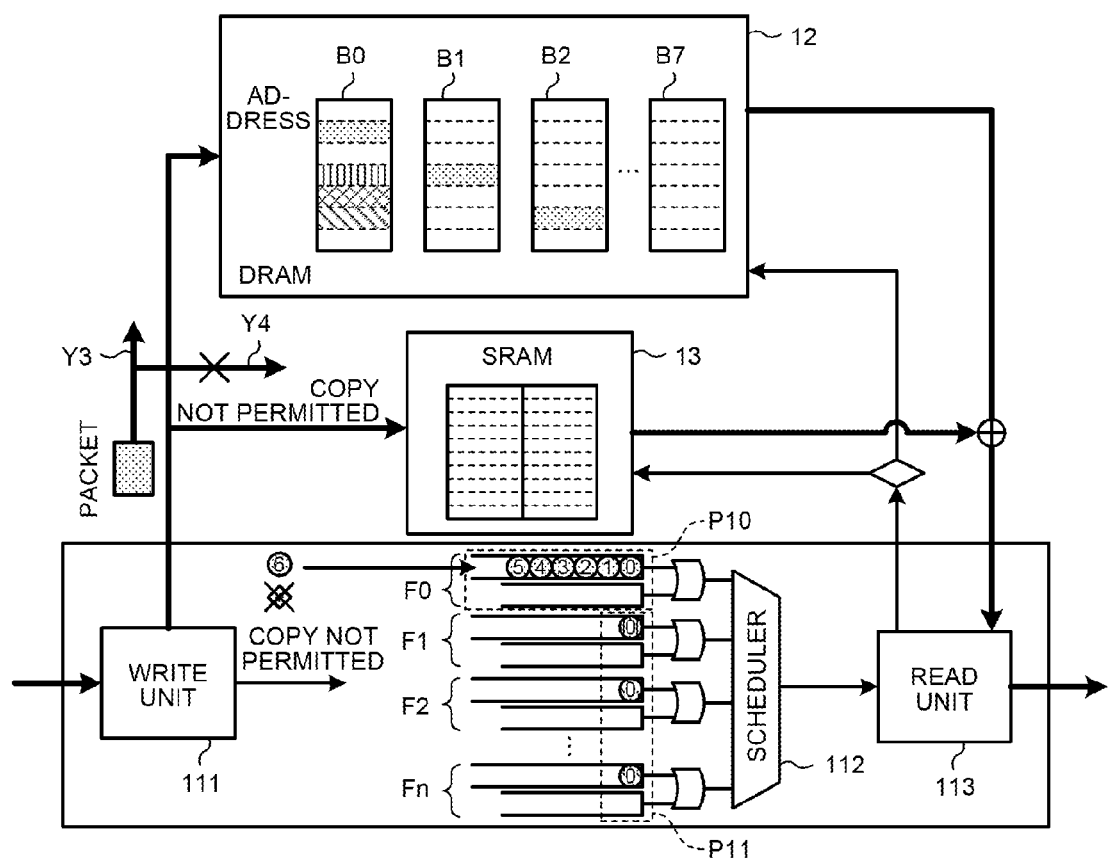
FIG. 13 is a diagram illustrating restrictions on parallel writing (copying) to the DRAM and the SRAM.

FIG. 13 is a diagram illustrating restrictions on parallel writing (copying) to the DRAM 12 and the SRAM 13. As described in the foregoing, parallel writing (copying) to the DRAM 12 and the SRAM 13 can be performed on condition that the pointer phases are aligned. However, since only four SRAM pointers can be contained in the queue, the scheduler 112 fails to align the phase on the SRAM side with the phase on the DRAM side when five or more DRAM pointers are contained as illustrated in FIG. 13. As a result, the above condition is not fulfilled, which hinders the packet processing apparatus 10 from using both the DRAM 12 and the SRAM 13 until the queue of the DRAM pointers is purged.

However, in the aforementioned case, as indicated by a pointer P10, the read unit 113 can fulfill the performance requirement by continuously reading the packets from the DRAM 12, which has a large amount of input packets, until no packet is left in the DRAM 12. In the case where, as indicated by a pointer P11, a plurality of flows simultaneously run short of pointers in the DRAM 12 (for example, only one DRAM pointer is left in the plurality of flows), the scheduler 112 selects only one flow during ten clk cycles in order to avoid the bank conflict. As a result, although it is temporary, the maximum packet reading rate is degraded to 1 pkt/10 clk, which is less than the performance requirement.

However, the aforementioned case of the plurality of flows simultaneously running short of packets is very rare. If the case does occur, the read unit 113 can still read from the DRAM 12 the packets equal in number to the banks (8 pkt/10 clk) at the maximum. Accordingly, the aforementioned performance degradation can be recovered with the passage of time. In a relatively long span (for example, about 10 minutes to 1 hour), the impact of the aforementioned temporary performance degradation on the performance of the packet processing apparatus 10 itself is sufficiently small.

Figure 14A:
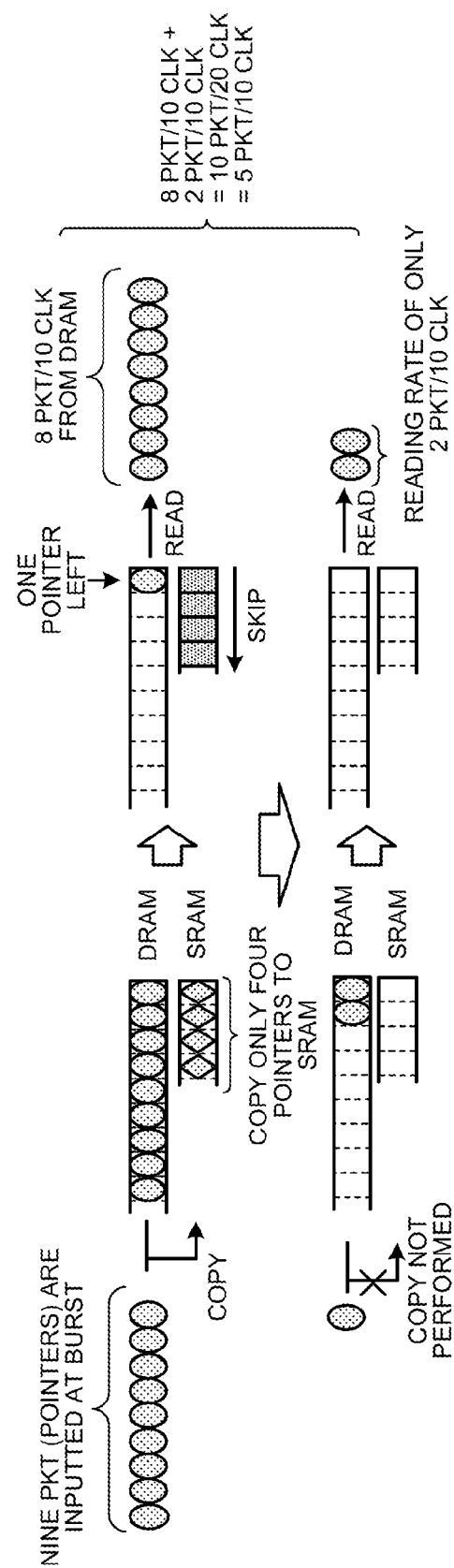
FIG. 14A is a diagram illustrating the restrictions on parallel writing (copying) to the DRAM and the SRAM more in detail.

Hereinafter, the restrictions on the parallel writing (copying) will be described more in detail with reference to FIG. 14A. FIG. 14A is a diagram illustrating the restrictions on parallel writing (copying) to the DRAM 12 and the SRAM 13 more in detail. Assume the case where the read unit 113 reads packets of a certain flow and as a result, both the DRAM 12 and the SRAM 13 in the flow become empty or still have pointers with their phases in alignment. In this case, parallel writing to both the buffers is possible in the next packet writing. However, in the case where the phases are not in alignment, i.e., in the case of "DRAM pointer length≠SRAM pointer length," writing (copying) to the SRAM 13 is not performed, but input packets are written only to the DRAM 12 as illustrated in FIG. 13.

As illustrated in FIG. 14A, when nine packets are inputted to a certain flow at a burst, the flow is selected by the scheduler 112. Then, eight packets which are equal in number to the banks of the DRAM 12 are read from the DRAM 12 during ten clk cycles to avoid the bank conflict. Since nine pointers are contained in the flow, one packet is still left in the DRAM 12. If one more packet is inputted in this state, DRAM pointer length (=1)≠SRAM pointer length (=0) at this point, and so the condition of parallel writing (copying) is not satisfied. Accordingly, parallel writing is not performed and writing is performed only to the DRAM 12. Therefore, the subsequent packets are not written to the SRAM 13 until the DRAM 12 becomes empty. As a result, if the same flow is selected again next time, the read unit 113 can read the packets only from the DRAM 12 since the SRAM 13 is empty. If the read unit 113 tries to perform additional packet reading from the DRAM 12 in other flows, a plurality of flows are to be selected during ten clk cycles. This makes it difficult to avoid occurrence of the bank conflict.

More specifically, when the SRAM 13 is empty and the DRAM 12 contains only one to four packets in one flow, and this flow is successively selected, the read unit 113 can read only four packets at most in ten clk cycles during this period as illustrated in FIG. 14A. As a result, the packet processing apparatus 10 temporarily fails to fulfill the performance requirement. However, as described in the foregoing, it is rare that the aforementioned flow is successively selected to the extent that performance degradation is recognized. As the pointers are contained in the flow gain, it becomes possible to read the packets from the DRAM 12 at the rate of 8 pkt/10 clk. Therefore, the performance is recovered.

For example, in the example illustrated in FIG. 14A, the packets are read at 8 pkt/10 clk in the first reading. In the second reading, however, reading is performed only at 2 pkt/10 clk. Even in this situation, a total packet reading rate is 10 pkt/20 clk, so that the packets are read at the performance requirement of 5 pkt/10 clk. Therefore, sufficient performance is provided.

FIG. 14B is a diagram illustrating an example in which the same packet is redundantly read as a result of performing parallel writing (copying) without aligning the phases of the pointers. If the parallel writing to the DRAM 12 and the SRAM 13 is performed while the phases of the pointers are not in alignment as illustrated in FIG. 14B, a remaining DRAM pointer P12 causes deviation in the phase of a SRAM pointer P13. Accordingly, the scheduler 112 skips the pointer P12 on the DRAM 12 side in concurrence with reading of the packet from the SRAM 13. Consequently, in the next reading, the pointer P13 on the DRAM 12 side is read, but at that point of time, reading of the pointer P13 is already finished on the SRAM 13 side. Therefore, the DRAM pointer P13 following the DRAM pointer P12 is redundantly read. As described in the foregoing, this redundant reading problem can be solved by including "DRAM pointer length=SRAM pointer length" in the conditions of the parallel writing of the packets in the packet processing apparatus 10, so that the pointer phases are aligned.

When selecting a plurality of flows during ten clk cycles, the scheduler 112 may select a plurality of flows from the SRAM 13 which is free from the bank conflict, or may select one or more flows from the SRAM 13 after selecting one flow from the DRAM 12. It is to be noted that a period of time (hereinafter referred to as "latency") is present from the point of receiving a read request to the point of actually reading the packets in the DRAM 12 and the SRAM 13. Generally, the latency of the DRAM 12 is larger than the latency of the SRAM 13. Accordingly, when a read request is made in order of the DRAM 12 and the SRAM 13, packets may possibly be read in the order different from a desired flow order.

Figure 15:
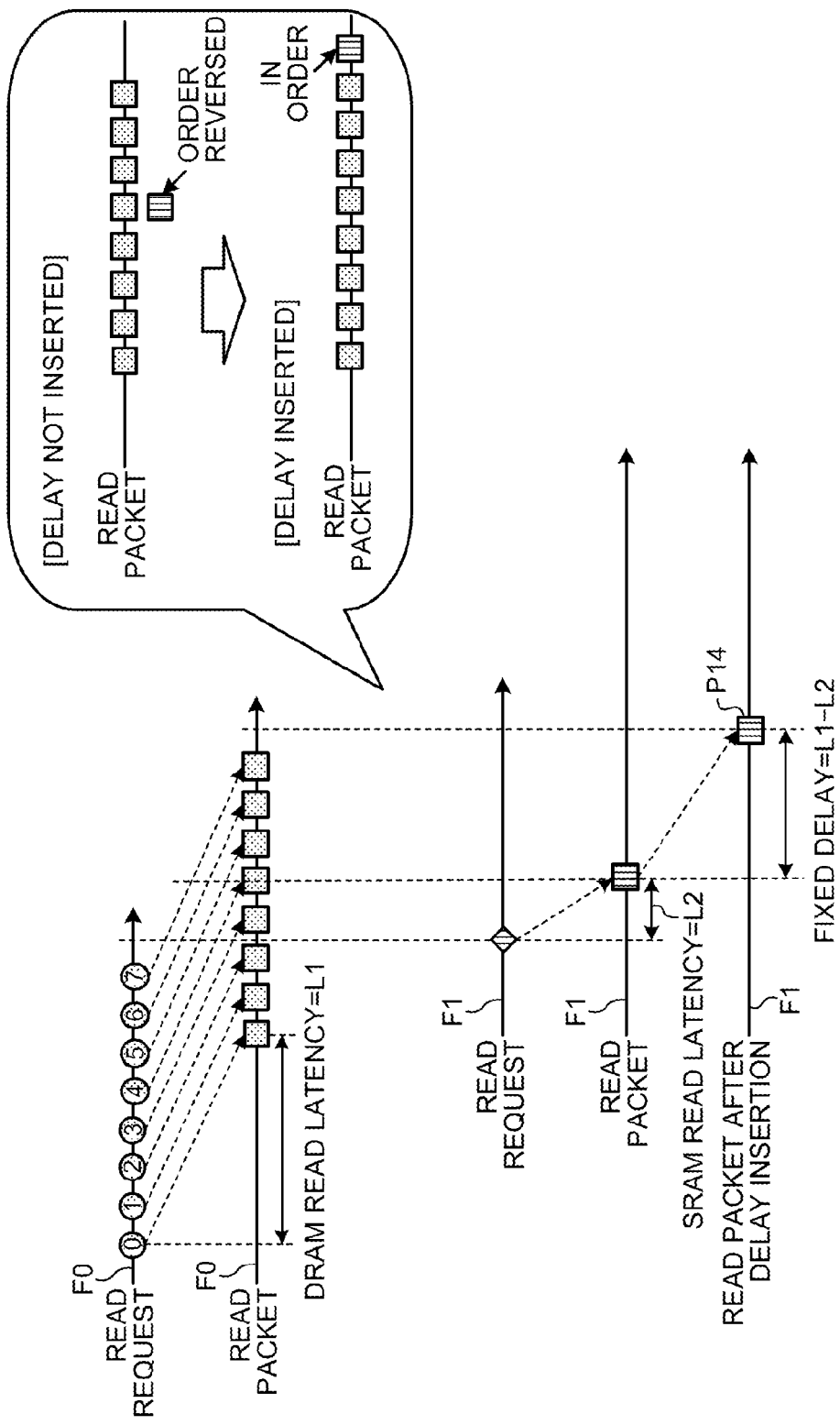
FIG. 15 is a diagram illustrating a case where the read unit delays the packets read from the SRAM to adjust latency between the DRAM and the SRAM.

FIG. 15 is a diagram illustrating the case where the read unit 113 delays the packets read from the SRAM 13 to adjust the latency between the DRAM 12 and the SRAM 13. In FIG. 15, the numeric characters in the pointers correspond to bank numbers. For example, when the numeric character in a pointer is "3," the packet indicated by the pointer is stored in the bank B3 of the DRAM 12. As illustrated in FIG. 15, the latency in the DRAM 12 is referred to as DRAM read latency L1. In the bank sequential reading, the DRAM read latency L1 is constant (for example, five nanoseconds) between respective packets. The latency in the SRAM 13 is referred to as SRAM read latency L2. The SRAM read latency L2 is constant (for example, one nanosecond) between respective packets.

Accordingly, when a delay is not inserted, a packet of the flow F1 stored in the SRAM 13 is read ahead of a packet of the flow F0 stored in the DRAM 12. As a result, the reading order is possibly reversed from the original reading order. Accordingly, since the latency values of the respective packet buffers (DRAM 12, SRAM 13) are known, the read unit 113 inserts a fixed delay to the packets read from the SRAM 13 to coincide the latency periods of the respective packet buffers as indicated by a packet P14 of FIG. 15. More specifically, the read unit 113 inserts to the packets read from the SRAM 13 delay time corresponding to a difference between first latency time generated in reading from the DRAM 12 and second latency time generated in reading from the SRAM 13 so as to match the latency time (latency) of the DRAM 12 and the SRAM 13. Accordingly, reversal of the packet reading order between the flows F0 and F1 is cleared, which enables the packets to be read in the desired original order. As a result, the packet processing apparatus 10 can output the packets to the outside of the apparatus in a controlled flow order (for example, in order of the flows F0 and F1).

Next, a difference between related read processing and read processing according to the present embodiment will be described with reference to FIGS. 16 and 17. In the description, it is premised that the scheduler 112 selects five flows during ten clk cycles in order of decreasing precedence, and that one pointer is contained in each of the selected flows.

Figure 16:
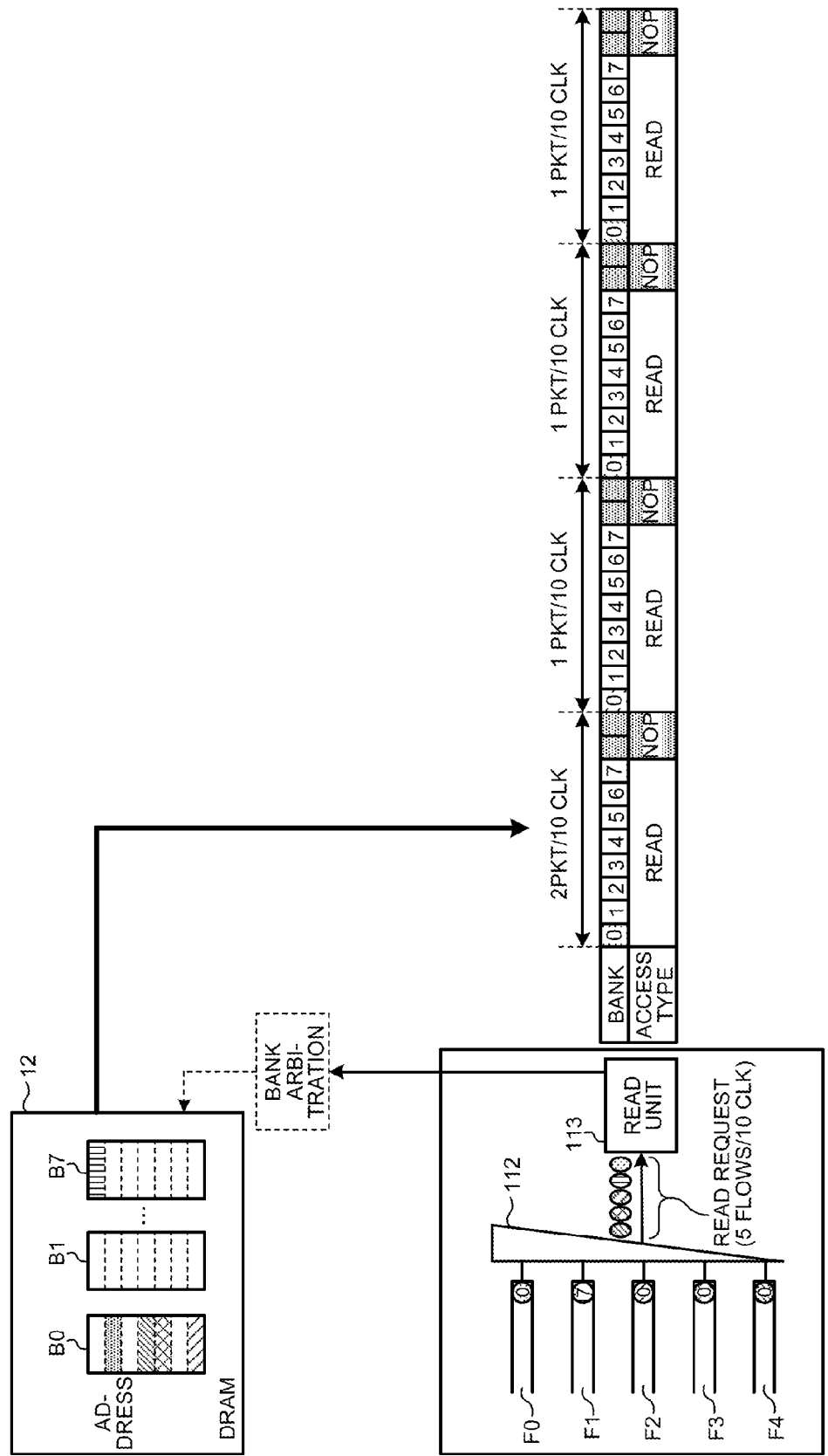
FIG. 16 is a diagram illustrating read processing by the packet processing apparatus which uses only the DRAM as a packet buffer.

FIG. 16 is a diagram illustrating read processing by the packet processing apparatus 10 which uses only the DRAM 12 as a packet buffer. In FIG. 16, the numeric characters in the pointers correspond to bank numbers. For example, when the numeric character in a pointer is "0," the packet indicated by the pointer is stored in the bank B0 of the DRAM 12. NOP (no operation) represents the state of no access due to switchover of buses and the like.

As illustrated in FIG. 16, banks B0, B7, B0, B0, and B0 are assigned to five selected flows F0 to F4 in a selected order. In this case, since the first bank B0 (bank for the pointer of the flow F0) is different from the next bank B7 (bank for the pointer of the flow F1), the bank conflict does not occur in the read processing. Accordingly, two packets are readable during ten clk cycles. However, each of the following banks B0 (bank for the pointer of the flow F2), B0 (bank for the pointer of the flow F3), and B0 (bank for the pointer of the flow F4) has bank conflict with each of their previous banks. In this case, the packets are read at time intervals of at least tRC(=10 clk). As a result, the packet processing apparatus 10 takes 40 clk cycles to complete reading of all five packets.

Figure 17:
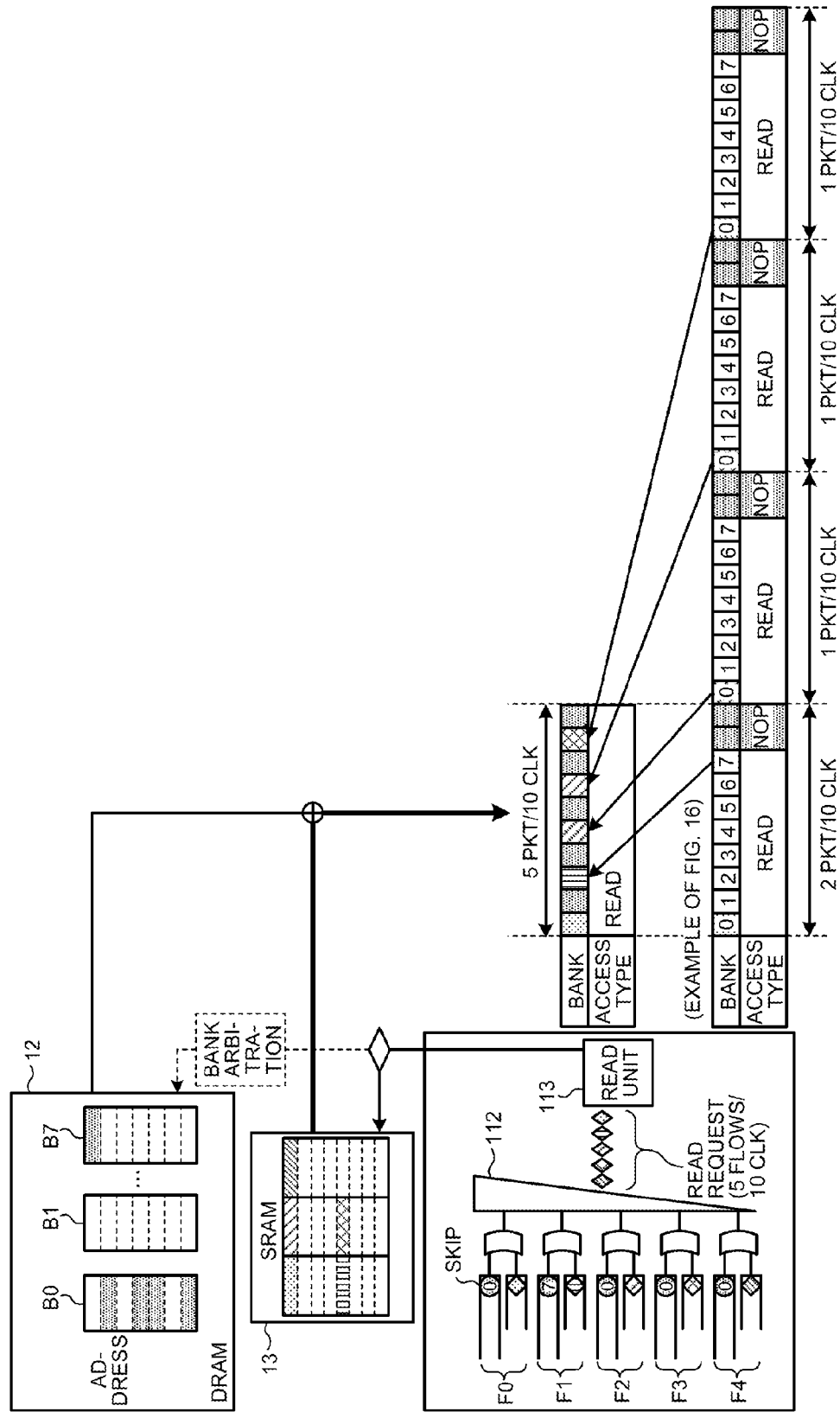
FIG. 17 is a diagram illustrating read processing by the packet processing apparatus which uses both the DRAM and the SRAM as a packet buffer.

FIG. 17 is a diagram illustrating read processing by the packet processing apparatus 10 which uses both the DRAM 12 and the SRAM 13 as a packet buffer. In FIG. 17, the numeric characters in the pointers correspond to bank numbers. For example, when the numeric character in a pointer is "0," the packet indicated by the pointer is stored in the bank B0 of the DRAM 12. In the example illustrated in FIG. 17, the number of pointers contained in each of the flows F0 to F4 is four or less. Therefore, the read unit 113 of the packet processing apparatus 10 reads the packets identified by the respective pointers from the SRAM 13, and skips the pointers, which are equal in number to the read pointers, on the DRAM 12 side. This enables the packets to be read at 5 pkt/10 clk which is faster than 5 pkt/40 clk.

Figure 18A:
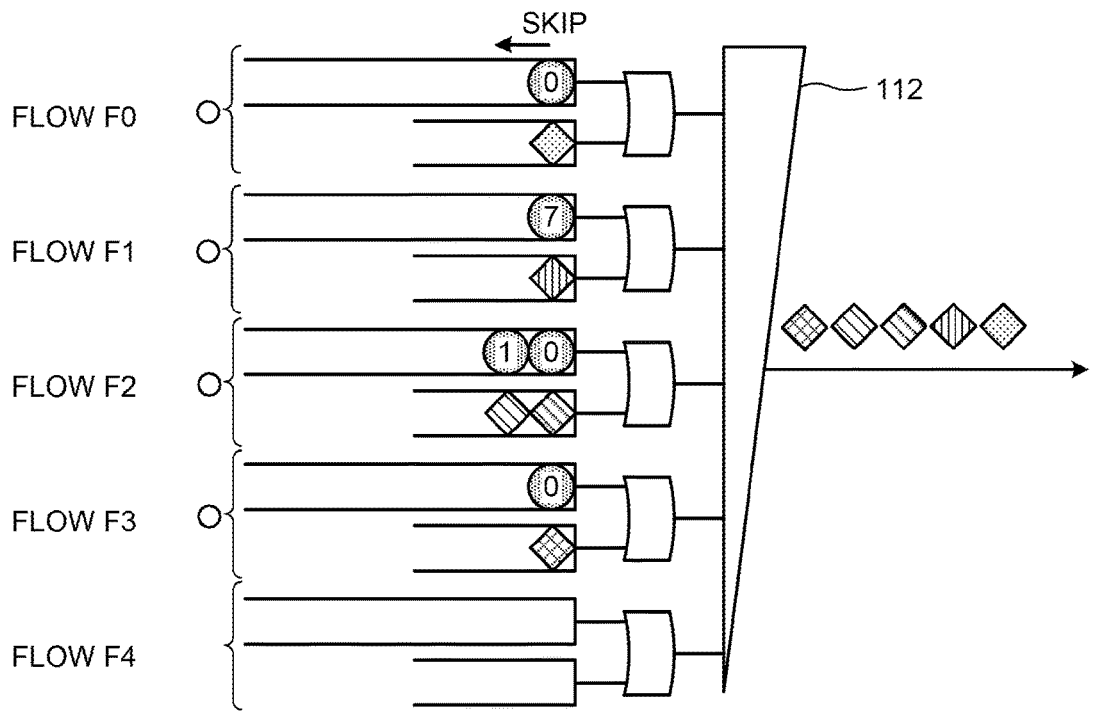
FIG. 18A is a diagram illustrating selection of flows when all the flows contain less than four pointers.
Figure 18B:
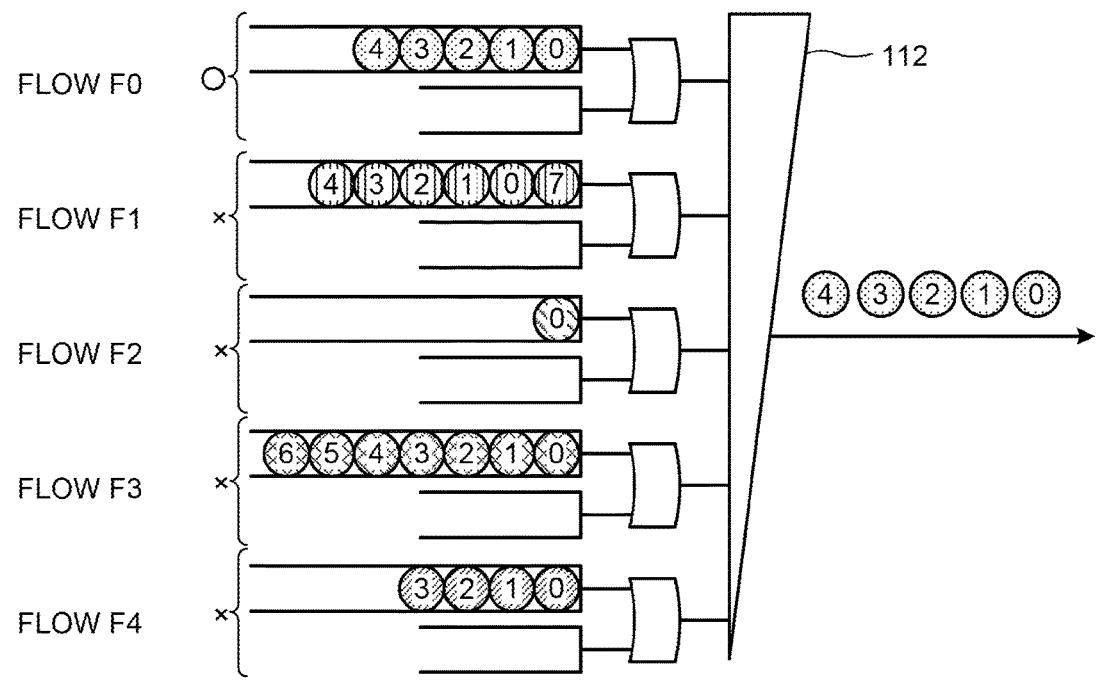
FIG. 18B is a diagram illustrating selection of flows when there is no pointer in the SRAM.
Figure 18C:
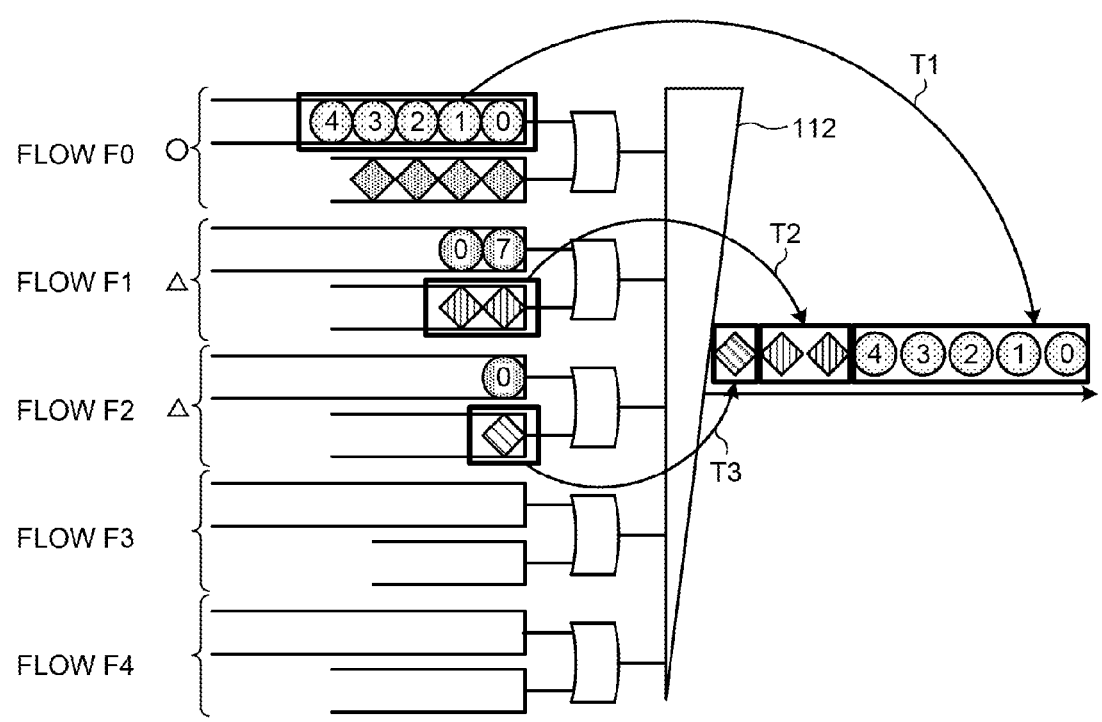
FIG. 18C is a diagram illustrating selection of flows when there is a flow containing five or more pointers.
Figure 20:
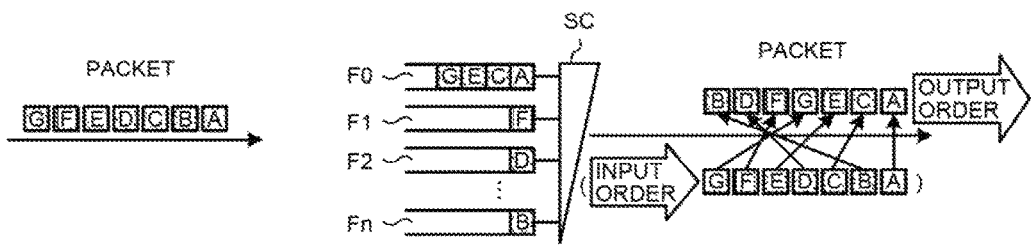
FIG. 20 is a diagram illustrating input and output orders of packets changed by the QoS control.
Figure 21:
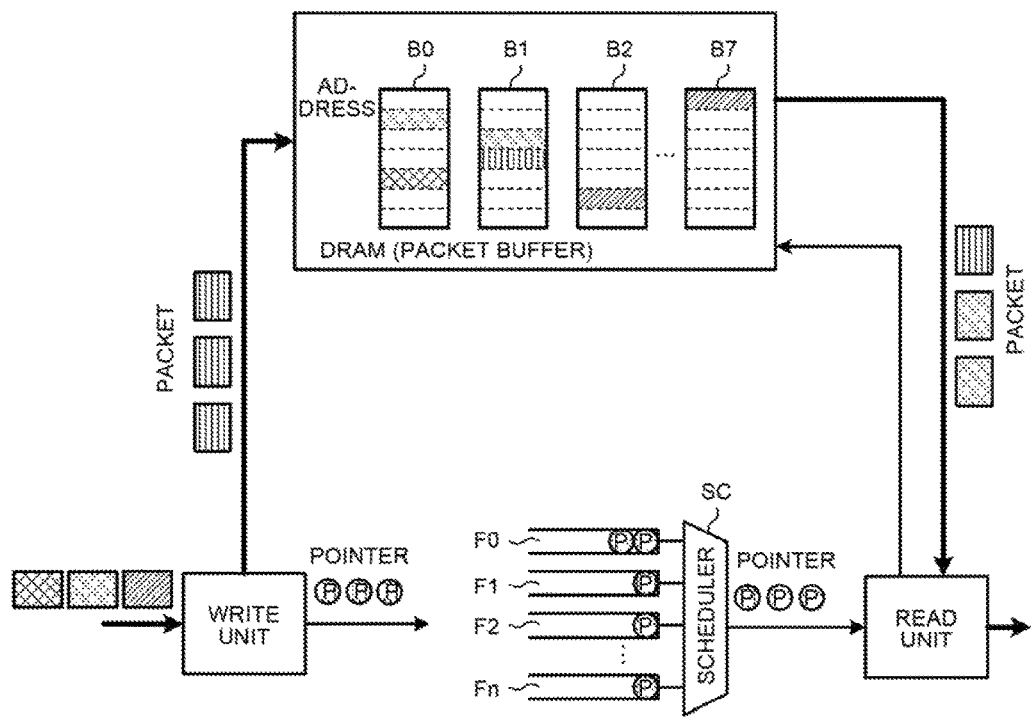
FIG. 21 is a diagram illustrating processing to write and read packets by using pointers.
Figure 22:
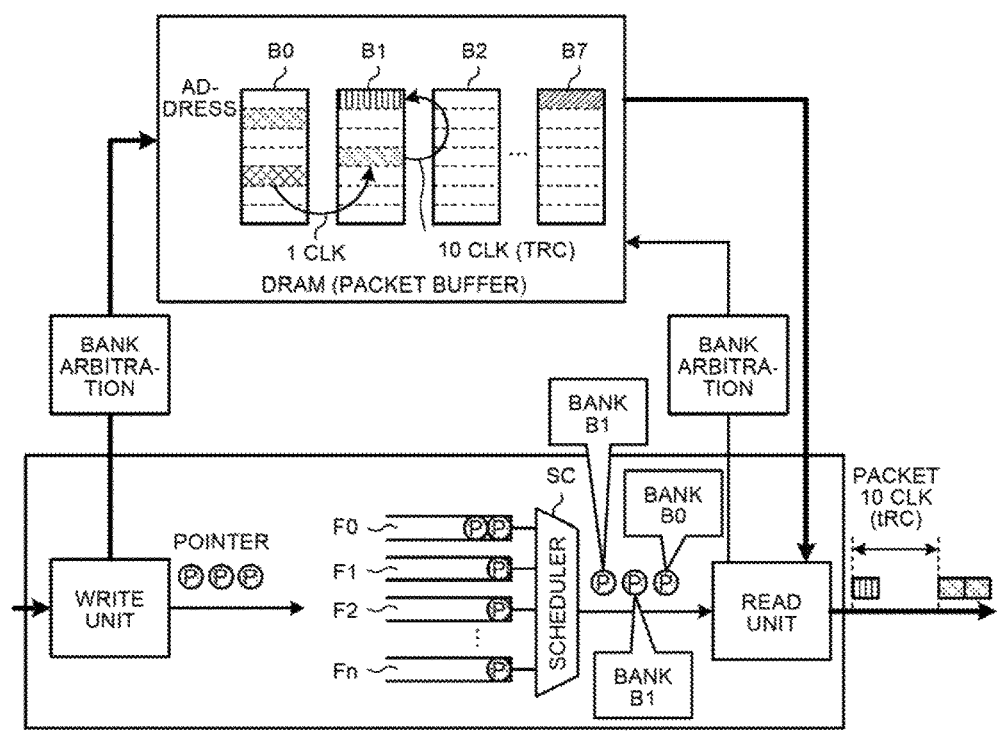
FIG. 22 is a diagram illustrating bank arbitration performed in writing and reading the packets.
Figure 23:
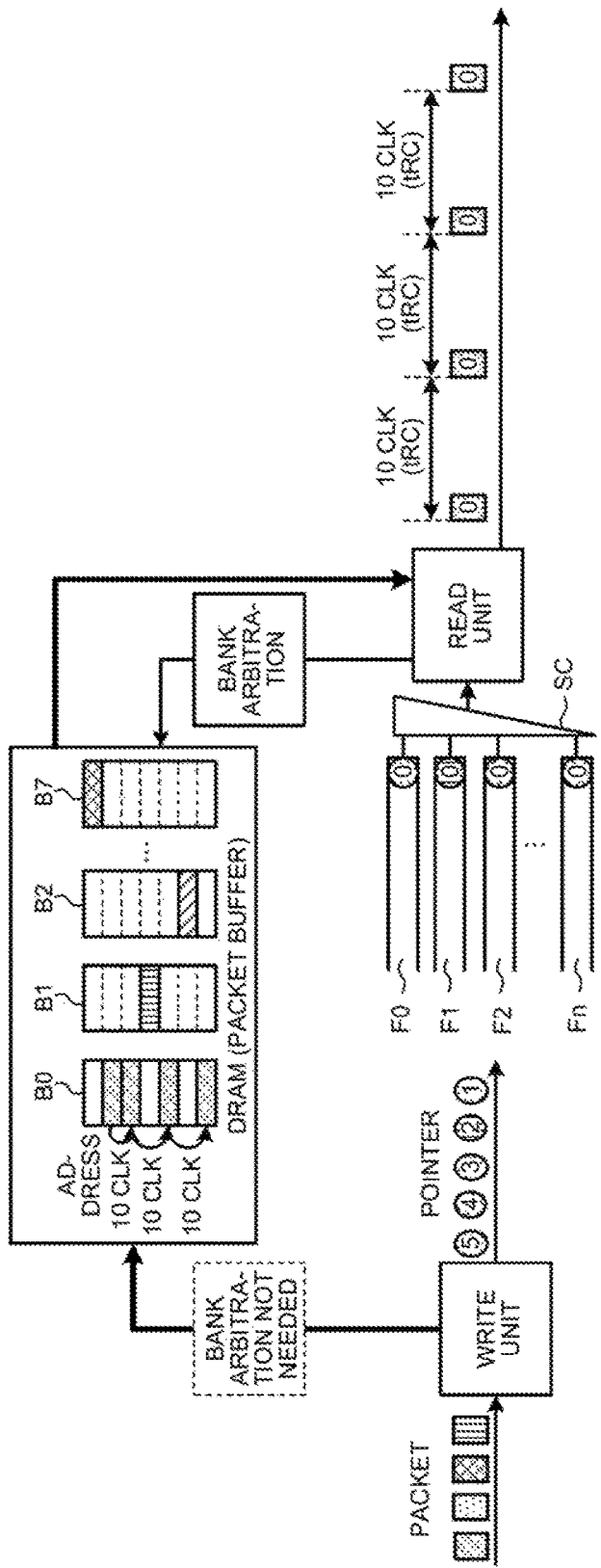
FIG. 23 is a diagram illustrating packet processing executable without bank arbitration on the writing side.

Next, three cases of flow selection from the flows F0 to F4 will be described with reference to FIGS. 18A to 18C. In the description, it is premised that the scheduler 112 can select up to five flows in 10 clk cycles. In FIGS. 18A to 18C, the numeric characters in the pointers correspond to bank numbers. For example, when the numeric character in a pointer is "0," the packet indicated by the pointer is stored in the bank B0 of the DRAM 12.

FIG. 18A is a diagram illustrating selection of flows when all the flows F0 to F4 contain less than four pointers. In the case 1 illustrated in FIG. 18A, the flows F0, F1, and F3 each contain one pointer, while the flow F2 contains two pointers. In this case, the scheduler 112 of the packet processing apparatus 10 selects four flows indicated by a round mark in order from the flows F0 to F3. Then, the read unit 113 reads the packet of one pointer from the DRAM 12 in each of the flows F0, F1, and F3 among the selected flows, and reads the packets of two pointers from the DRAM 12 in the flow F2. As a result, reading at 5 pkt/10 clk which fulfills the performance requirement is achieved.

FIG. 18B is a diagram illustrating selection of flows when there is no pointer in the SRAM 13. In the case 2 illustrated in FIG. 18B, there is a possibility of the bank conflict in the DRAM 12. Therefore, the scheduler 112 can select only one flow during ten clk cycles. In the case 2, since the flow F0 on the DRAM 12 side contains five pointers, the scheduler 112 selects the flow F0 as indicated by the round mark, for example. The packets indicated by the above pointers are written in advance to the DRAM 12 in units of flows in the bank sequential manner. Accordingly, the read unit 113 can read the packets at 5 pkt/10 clk without the bank conflict. That is, reading can be executed at 5 pkt/10 clk which fulfills the performance requirement.

FIG. 18C is a diagram illustrating selection of flows when there is a flow containing five or more pointers. In the case 3 illustrated in FIG. 18C, the flow F0 contains five pointers in the DRAM 12 and four pointers in the SRAM 13, the flow F1 contains 2 pointers in both the buffers, and the flow F2 contains one pointer in both the buffers. In this case, since there is no bank conflict in the flow F0 as in the case 2, the read unit 113 can read the packets indicated by the pointers of the flow F0 from the DRAM 12 at 5 pkt/10 clk.

Further in the case 3, when the packets of the next selection candidate flows are readable from the SRAM 13, the scheduler 112 may select one flow selected from the DRAM 12 and additionally select a plurality of flows from the SRAM 13 as indicated by a triangle mark. In the example illustrated in FIG. 18C, the flow F1 contains two pointers on the SRAM 13 side, and the flow F2 also contains one pointer on the SRAM 13 side. That is, the packets subsequent to the packets read from the DRAM 12 are readable from the SRAM 13. Accordingly, unlike the case 2, there is no possibility of the bank conflict between the flows. Therefore, as illustrated in FIG. 18C, the scheduler 112 may select the flow F0 (T1) and then select the plurality of flows F1 and F2 (T2, T3).

When the scheduler 112 selects the flows F1 and F2 in addition to the flow F0, the read unit 113 can read the packets indicated by the pointers of the respective flow F0, F1, and F2 from the DRAM 12 at 8(=5+2+1) pkt/10 clk. However, in this case, the read unit 113 inserts the fixed delay (see FIG. 15) to the read packets from the SRAM 13 to prevent the packets from being read ahead of the packets read from the DRAM 12.

As described in the foregoing, in all of the above cases, the packet processing apparatus 10 can implement the performance requirement of 5 pkt/10 clk or more.

As described above, the packet processing apparatus 10 includes the DRAM 12, the SRAM 13, the scheduler 112, and the read unit 113. The DRAM 12 stores packets. The SRAM 13 stores the packets. The scheduler 112 determines the memory from which the packets are read, out of the DRAM 12 and the SRAM 13, in accordance with the number of the pointers indicative of storage locations of the packets in the DRAM 12. The read unit 113 reads the packets stored at the storage locations indicated by the pointers, from the memory determined by the scheduler 112. For example, when the number of pointers in the DRAM 12 is a specified value (for example, five) or more, or when there is no pointer in the SRAM 13, the scheduler 112 determines the DRAM 12 as the memory from which the packets are read. When the number of pointers in the DRAM 12 is less than the specified value and when there is a pointer in the SRAM 13, the scheduler 112 determines the SRAM 13 as the memory from which the packets are read.

In other words, the packet processing apparatus 10 has the SRAM 13 in parallel with the DRAM 12 and switches the packet buffers in accordance with the number of read pointers. As a result, the packet processing apparatus 10 suppresses performance degradation caused by the bank conflict which can occur in reading when only the DRAM 12 is used as a buffer. The requested capacity of the SRAM 13 provided in parallel may be a minimum capacity depending on the performance requirement. For example, when the performance requirement is 5 pkt/10 clk, the SRAM 13 may preferably store four packets per flow. Therefore, the packet processing apparatus 10 can suppress increase in cost and power consumption relating to addition of the SRAM 13.

Modification

While the packets are stored in the DRAM and the SRAM (see FIG. 6) in the above embodiment, the pointers may be stored therein instead of the packets. FIG. 19 is a diagram illustrating a modification in which read buffers are switched in accordance with the number of read pointers in a selected flow. In FIG. 19, the numeric characters in the second pointers correspond to bank numbers. For example, when the numeric character in a second pointer is "0," a first pointer indicated by the second pointer is stored in a bank B0 of a DRAM 12a. Since write units 111g and 111h, DRAMs 12a and 12b, and read units 113f and 113g illustrated in FIG. 19 are identical in function to the write unit 111, the DRAM 12, and the read unit 113 illustrated in FIG. 6, respectively, the detailed descriptions thereof will be omitted.

Specifically, the packet processing apparatus 10 in the above embodiment is configured such that the packets themselves are stored in the DRAM 12 and the SRAM 13, and their pointers are queued in the scheduler 112. Contrary to this, the packet processing apparatus 10 in the modification has a more multi-stage configuration. More specifically, the packet processing apparatus 10 stores packets themselves in the DRAM 12b, and stores pointers of the packets in the DRAM 12a and the SRAM 13 as first pointers. Furthermore, the packet processing apparatus 10 queues pointers of the first pointers in the scheduler 112 as second pointers. For example, a reduced latency dynamic random access memory (RLDRAM) may be used as the DRAM 12a in this mode. For example, a double data rate (DDR) 3DRAM may be used as the DRAM 12b.

The packet processing apparatus 10 according to the modification includes the DRAM 12b, the DRAM 12a, the SRAM 13, the scheduler 112, and the read unit 113f. The DRAM 12b stores packets. The DRAM 12a stores first pointers indicative of storage locations of the packets in the DRAM 12b. The SRAM 13 stores the first pointers. The scheduler 112 determines the memory from which the first pointers are read, out of the DRAM 12a and the SRAM 13, in accordance with the number of the second pointers indicative of storage locations of the first pointers in the DRAM 12a. The read unit 113f reads the first pointers stored at the storage locations indicated by the second pointers, from the memory determined by the scheduler 112.

More specifically, the packet processing apparatus 10 according to the modification has the SRAM 13 used as a mini buffer in parallel with the DRAM 12a used as a first pointer buffer, and writes the first pointers to these buffers in parallel. In reading operation, the packet processing apparatus 10 reads the first pointers from one of the DRAM 12a and the SRAM 13, in accordance with the number of the read second pointers in the selected flow as in the disclosed embodiment. The first pointer contains information of about 100 bits including, for example, a flow ID, a packet length, and a buffer address as described before. Unlike the disclosed embodiment, the SRAM 13 may store not the packets themselves but the first pointers in this modification. Accordingly, the SRAM 13 may have a capacity as small as about 100 bits×the number of flows×4 pointers. For example, when the number of flows to be stored in the scheduler 112 is 100 K, the SRAM 13 uses only about 40 megabits. Therefore, the packet processing apparatus 10 can be simply configured with use of an existing SRAM which is built in FPGAs, ASICs, NPUs, and the like to suppress the packet processing delay caused by the bank conflict. Since the packet processing apparatus 10 can use the existing memory without adding a new one, a circuit scale and power consumption can be reduced.

The above modification has a three-stage configuration including the packets, the first pointers (pointers of the packets), and the second pointers (pointers of the first pointers). However, depending on the capacity of the SRAM 13 or the number of the first pointers, the packet processing apparatus 10 may be configured to have four or more stages formed by adding third pointers (pointers of the second pointers) and the like.

In the disclosed embodiment, the rate of 5 pkt/10 clk is assumed as a performance requirement. In response to this rate, the packet processing apparatus 10 uses five pointers as a threshold value to switch the read buffers. However, the threshold value is not limited to five pointers but may properly be changed in accordance with the performance requirement. For example, when the performance requirement is increased to 7 pkt/10 clk, the packet processing apparatus 10 may set the threshold value to seven pointers. More specifically, when the number of read pointers is "seven" or more, the packet processing apparatus 10 reads packets from the DRAM 12, whereas when the number is "six" or less, the packet processing apparatus 10 may read the packets from the SRAM 13.

Furthermore, in the disclosed embodiment, the respective components of the packet processing apparatus 10 do not need to be physically configured as illustrated in the drawings. That is, the specific states of the devices, whether distributed or integrated, are not limited to the illustrated ones. All or part of the devices may be configured to be functionally or physically distributed or integrated in arbitrary units according to various loads and use conditions. For example, the pointer generation unit 111c and the pointer adder unit 111d in the write unit 111, or the read pointer number extraction unit 112b and the read buffer determination unit 112c in the scheduler 112 may be integrated as one component member. Contrary to this, the read flow selection unit 112a may be distributed into a unit that determines whether or not the flow ID "X" is selectable and a unit that determines whether or not the total number of the selected flows is "five" or more. Furthermore, the memories which store input packets and/or pointers may be prepared as external devices of the packet processing apparatus 10 and be connected via networks or cables. The SRAM 13 may be an internal memory of the QoS processing unit 11.

According to one aspect of the packet processing apparatus disclosed in this application, packet processing delay can be suppressed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A packet processing apparatus comprising:
a processor configured to execute a process including:
determining a memory from which packets are read, out of a first memory that stores the packets and a second memory that stores the packets, in accordance with a number of pointers indicative of storage locations of the packets in the first memory; and
reading the packets stored at the storage locations indicated by the pointers, from the memory determined at the determining, wherein
the determining includes, not actually reading the pointers in a buffer which has not been read-accessed, but skipping read addresses of the pointers by the number of pointers in another buffer which has actually been read.

2. The packet processing apparatus according to claim 1, wherein
when the number of pointers of the first memory is a predetermined value or more, or when there is no pointer in the second memory, the determining includes determining the first memory as the memory from which the packets are read, and
when the number of pointers of the first memory is less than the predetermined value and there is a pointer in the second memory, the determining includes determining the second memory as the memory from which the packets are read.

3. The packet processing apparatus according to claim 1, wherein the first memory includes a plurality of sequentially accessible storage regions, and stores the packets in each of the storage regions.

4. The packet processing apparatus according to claim 1, wherein the determining includes storing the pointers per flow and determining the memory from which the packets are read in accordance with the number of the pointers in a selected flow.

5. The packet processing apparatus according to claim 1, wherein the reading includes inserting delay time to the packets read from the second memory, the delay time corresponding to a difference between first latency time generated in reading from the first memory and second latency time generated in reading from the second memory.

6. A packet processing apparatus comprising:
a processor configured to execute a process including:
determining a memory from which first pointers are read, out of a second memory that stores the first pointers indicative of storage locations of packets in a first memory that stores the packets and a third memory that stores the first pointers, in accordance with a number of second pointers indicative of storage locations of the first pointers in the second memory; and
reading the first pointers stored at the storage locations indicated by the second pointers, from the memory determined at the determining, wherein
the determining includes, not actually reading the first pointers in a buffer which has not been read-accessed, but skipping read addresses of the first pointers by the number of the second pointers in another buffer which has actually been read.

7. A packet processing method comprising:
determining a memory from which packets are read, out of a first memory that stores the packets and a second memory that stores the packets, in accordance with a number of pointers indicative of storage locations of the packets in the first memory by a processor; and
reading the packets stored at the storage locations indicated by the pointers, from the determined memory by the processor, wherein
the determining includes, not actually reading the pointers in a buffer which has not been read-accessed, but skipping read addresses of the pointers by the number of pointers in another buffer which has actually been read.

* * * * *